(12) United States Patent
Marshall et al.

(10) Patent No.: US 11,620,793 B2
(45) Date of Patent: Apr. 4, 2023

(54) PRODUCING A REFINED CONTROL MESH FOR GENERATING A SMOOTH SURFACE OF AN OBJECT

(71) Applicant: Autodesk, Inc., San Francisco, CA (US)

(72) Inventors: Kevin James Marshall, Portland, OR (US); Nicholas Stewart North, Vineyard, UT (US); Adam Michael Helps, Provo, UT (US)

(73) Assignee: Autodesk, Inc., San Francisco, CA (US)

( * ) Notice: Subject to any disclaimer, the term of this patent is extended or adjusted under 35 U.S.C. 154(b) by 0 days.

(21) Appl. No.: 17/212,963

(22) Filed: Mar. 25, 2021

(65) Prior Publication Data

US 2022/0309749 A1    Sep. 29, 2022

(51) Int. Cl.
  *G06T 17/20*    (2006.01)
  *G06F 30/12*    (2020.01)
  *G06T 17/30*    (2006.01)

(52) U.S. Cl.
  CPC ............ *G06T 17/205* (2013.01); *G06F 30/12* (2020.01); *G06T 17/30* (2013.01)

(58) Field of Classification Search
  CPC ........ G06T 17/205; G06T 17/30; G06F 30/12
  See application file for complete search history.

(56) References Cited

U.S. PATENT DOCUMENTS

| | | | |
|---|---|---|---|
| 7,274,364 B2 | 9/2007 | Sederberg | |
| 9,269,189 B1 | 2/2016 | Marinov et al. | |
| 10,249,086 B2 | 4/2019 | Sederberg | |
| 2008/0043023 A1* | 2/2008 | Loop | G06T 17/30 345/441 |
| 2009/0303235 A1* | 12/2009 | Maekawa | G06T 17/205 382/300 |
| 2018/0293791 A1* | 10/2018 | Sederberg | G06F 30/13 |

(Continued)

OTHER PUBLICATIONS

Li et al., G1 Non-Uniform Catmull-ClarkSurfaces, SIGGRAPH '16 Technical Paper, 2016, pp. 8 (Year: 2016).*

(Continued)

*Primary Examiner* — Phuc N Doan
(74) *Attorney, Agent, or Firm* — Fish & Richardson P.C.

(57) ABSTRACT

Methods, systems, and apparatus, including medium-encoded computer program products, for computer aided design of structures include, in one aspect, a method for producing, the method including: obtaining a polygonal control mesh for a smooth surface representing an object; subdividing the polygonal control mesh in one or more subdivisions to produce a refined control mesh, wherein the subdividing comprises: using data defining an eigen polyhedron around an extraordinary point in the polygonal control mesh to generate adjustment rules to determine positions of the extraordinary point, and face points and edge points for faces adjacent to the extraordinary point, and determining, according to the adjustment rules, the positions for the extraordinary point, the face points, and the edge points for the faces adjacent to the extraordinary point; and generating, by the computer graphics application, the smooth surface for output from the refined control mesh.

20 Claims, 13 Drawing Sheets

(56) References Cited

U.S. PATENT DOCUMENTS

2019/0385366 A1* 12/2019 Sederberg .............. G06T 17/30
2020/0320785 A1  10/2020 Pförtner et al.

OTHER PUBLICATIONS

Li et al., Hybrid non-uniform recursive subdivision with improved convergence rates, 2019, pp. 20 (Year: 2019).*

Loop, C. and Schaefer, S. 2008. Approximating Catmull-Clark subdivision surfaces with bicubic patches. ACM Trans. Graph. 27, 1, Article 8 (Mar. 2008), pp. 11 (Year: 2008).*

Ben-Chen, "B-Spline and Subdivision Surfaces," published on or before Mar. 23, 2021, retrieved on Mar. 23, 2021, retrieved from URL<www.tsplines.com/>, 48 pages.

Catmull et al., "Recursively generated B-Spline surfaces on arbitrary topological meshes," Computer-Aided Design, 1978, 10(6):350-355.

Finnigan et al., "$G^1$ Non-Uniform Catmull-Clark Surfaces," ACM Transactions on Graphics, 2016, 35(4):1-8.

Floater, "The Inverse of a Rational Bilinear Mapping," Computer Aided Geometric Design, 2015, 33:46-50.

Rorydriscoll.com [online], "Catmull-Clark Subdivision: The Basics," published on Nov. 10, 2017, retrieved on Mar. 23, 2021, retrieved from URL<http://www.rorydriscoll.com/2008/08/01/catmull-clark-subdivision-the-basics/>, 10 pages.

Sederberg et al., "T-Splines and T-NURCCs," ACM Transactions on Graphics, 2003, 22(3):477-484.

Sederberg et al., "Knot Intervals and Multi-Degree Splines," Computer Aided Geometric Design, 2003, 23(2):455-468.

Sederberg et al., "Non-Uniform Recursive Subdivision Surfaces," Proceedings of the 25th Annual Conference on Computer Graphics and Interactive Techniques, 1998, pp. 387-394.

Wikipedia.org, "Catmull-Clark subdivision surface," published on Aug. 27, 2017, retrieved on Mar. 23, 2021, retrieved from URL<https://en.wikipedia.org/wiki/catmull%E2%80%93Clark_Subdivision_surface/>, 4 pages.

Wikipedia.org, "Non-uniform rational B-Spline," published on Jan. 19, 2021, retrieved on Jan. 26, 2021, retrieved from URL<https://en.wikipedia.org/wiki/non-uniform_rational_b-spline>, 8 pages.

Wikipedia.org, "Subdivision Surface," published on Oct. 26, 2017, retrieved on Mar. 23, 2021, retrieved from URL<https://en.wikipedia.org/wiki/subdivision_surface/>, 5 pages.

* cited by examiner

PRODUCING A REFINED CONTROL MESH FOR GENERATING A SMOOTH SURFACE OF AN OBJECT

BACKGROUND

This specification relates to surface modelling in computer graphics applications, such as computer generated animation and/or computer aided design of physical structures to be manufactured using additive manufacturing, subtractive manufacturing and/or other manufacturing systems and techniques.

Computer graphics applications include different software products and/or services that support generation of representations of three-dimensional (3D) objects that can be used for manufacturing of physical structures corresponding to the objects, for visualization of scenes on display frames, for animation and video rendering, etc. Computer Aided Design (CAD) software has been developed and used to generate 3D representations of objects, and Computer Aided Manufacturing (CAM) software has been developed and used to manufacture the physical structures of those objects, e.g., using Computer Numerical Control (CNC) manufacturing techniques. Computer Aided Industrial Design (CAID) programs are a subset of CAD software programs that support generation of representations of 3D objects with a focus on technical aspects of the design methodology for presenting organic shapes and complex curves. Computer-Aided Engineering (CAE) software supports engineering analysis tasks and enables users to perform simulation, validation, evaluation, and optimization tasks related to manufacturing physical entities using CNC manufacturing techniques.

Typically, CAD software stores the 3D representations of the geometry of the objects being modeled using a boundary representation (B-Rep) format. A B-Rep model is a set of connected surface elements specifying boundaries between a solid portion and a non-solid portion of the modelled 3D object. In a B-Rep model (often referred to as simply a B-Rep), geometry is stored in the computer using smooth and precise mathematical surfaces, in contrast to the discrete and approximate surfaces of mesh model geometry, which can be difficult to work with in a CAD program. Other types of smooth surface models used in CAD programs include Non-Uniform Rational Basis Splines (NURBS), Non-Uniform Catmull-Clark (NURCCS) surfaces, Catmull-Clark subdivision surfaces, T-Splines, among other example models.

NURBS is a smooth surface modelling representation commonly used in 3D computer graphics applications (e.g., CAD, CAM, and CAE products) as the primary representation of surfaces, and are part of various industry wide standards. NURBS surfaces models are commonly used in computer graphics for representing curves and surfaces. A NURBS surface is a geometric representation of a smooth surface where the NURBS surface is described by its degree, weighted control vertices, and knot vector. NURBS surfaces are a generalization of Bézier surfaces.

Computer graphics applications also include computer animation programs and video production applications that generated 3D representations of objects in motion. In 3D computer graphics applications, a Subdivision Surface is a geometric representation of a smooth surface in which the smooth surface is defined by a piecewise linear polygon mesh. The smooth surface is calculated from the polygon mesh using a predefined refinement scheme that determines the limit of recursive subdivision of each polygon face into smaller faces that better approximate the smooth surface. In some Subdivision Surface applications, the limit surface is calculated directly using known techniques, rather than through recursive procedure calls. Subdivision Surfaces are often used for the creation and final rendering of character shapes in computer animation.

Computer graphics software applications can be used in conjunction with subtractive manufacturing systems and techniques, such as CNC machine cutting, electrode discharge machining, chemical machining, and waterjet machining, to generate physical entities from the designed 3D models. For example, CAD software has been used in conjunction with additive manufacturing systems and techniques, also known as solid free form fabrication or 3D printing, such as Fused Filament Fabrication (FFF) and Selective Laser Sintering (SLS). In addition, CAD software has been designed so as to perform automatic generation of 3D geometry (generative design) for a part or one or more parts in a larger system of parts to be manufactured. The output from generative design algorithms is typically a discretized polygon mesh, similar to the output from object scanning systems and techniques.

To be useable in a computer graphics application, such polygon meshes are typically converted into modelled surfaces composed of a control mesh and control vertices that define smooth surface patches of the complex modelled surface, e.g., a polygon mesh is converted into a complex T-Spline surface model.

SUMMARY

This specification relates to surface modelling in computer graphics applications, such as computer generated animation and computer aided design of physical structures to be manufactured using additive manufacturing, subtractive manufacturing, and/or other manufacturing systems and techniques, in which limit surfaces having at least C1 continuity are produced from polygonal control meshes, e.g., for a Subdivision Surface. Particular embodiments of the subject matter described in this specification can be implemented to realize one or more of the following advantages.

Subdivision surfaces as a geometric representation of a smooth surface in which the smooth surface is defined by a piecewise linear polygon mesh may suffer from surface defects around extraordinary points (e.g., non-uniform and uniform extraordinary points). Standard subdivision techniques may create bi-modal blending functions around non-uniform star points. These bi-modal blending functions can be associated with limit surface defects (e.g., peaks and troughs) around extraordinary points if a subdivision may allow for the control mesh to collapse to a line in an area around the extraordinary point.

In some implementations, polygon meshes can be converted into modelled surfaces composed of a control mesh and control vertices that define smooth surface patches of the complex modelled surface. However, even though the individual surface patches are smooth and precise mathematical surfaces, the larger complex surface model can suffer from surface defects, e.g., surface bumps. Approaches to smooth 3D surface models may not work well with such complex surfaces because if the high-frequency variation of the input surfaces is reduced, a loss of details in the resultant complex modelled surface can be exhibited.

Experiencing such defects can be avoided (or at least reduced to a large extent) by using eigen polyhedron derived rules for subdividing an arbitrary polygonal control mesh without restrictions on the underlying surface, as described in this specification. Eigen polyhedron data defined for an eigen polyhedron structure around an extraordinary point can facilitate subdivisions when the underlying polygonal mesh has equal first knot intervals for first edges and second knot intervals for second edges, where the first edges are directly connected with the extraordinary point and are inside the region corresponding to the eigen polyhedron, and the second edges are directly connected with the first edges and are outside the region corresponding to the eigen polyhedron. Therefore, eigen polyhedron data can be used for defining rules for subdividing uniform surfaces, as first and second knot intervals are equal, and may not be directly applicable at least without adjustments or a need for additional processing steps, e.g., preprocessing steps to non-uniform surfaces to convert it into a uniform one. The eigen polyhedron data can be used to allow for subdivisions that scale and translate the eigen polyhedron to prevent the control mesh from collapsing to a line in the area of the extraordinary point. Therefore, in accordance with the implementations of the present application to use eigen polyhedron data and to apply it for an arbitrary mesh having either uniform or non-uniform regions around extraordinary points, refinement rules can be defined based on adjustments to the data for the eigen polyhedron defined around the extraordinary point (either uniform or non-uniform) to scale and translate faces around the extraordinary point at the eigen polyhedron so that after a single subdivision a generated refined mesh corresponds to an eigen polyhedron structure.

Thus, a method including subdividing an arbitrary control mesh including uniform and/or non-uniform extraordinary points can be performed based on eigen polyhedron data and adjustment rules for subdivisions in a region around an extraordinary point. By those subdivisions, a refined control mesh can be generated that has better accuracy and preciseness of presenting the smooth surface. Improvements in the accuracy of the smooth surface representation of an object can also provide improvements for the manufacturing process of the object. Further, the subdivision as performed can include adjustments to a subset of face points and edge points for faces around the extraordinary point as defined in eigen polyhedron data, where such adjustments are compatible with uniform and non-uniform surfaces around extraordinary points. Therefore, the provided subdivisions are more flexible and efficient to implement for arbitrary surfaces without additional preprocessing steps.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

The present disclosure describes various tools and techniques for generating smooth surfaces for output by a computer graphics application. The smooth surfaces can be generated based on a refined control mesh that is generated by subdividing an obtained polygonal control mesh based on using eigen polyhedron data defined for an extraordinary point and applying adjustment rules to determine face points, edge points, and vertex points defined in regions around the extraordinary point.

Figure 1:
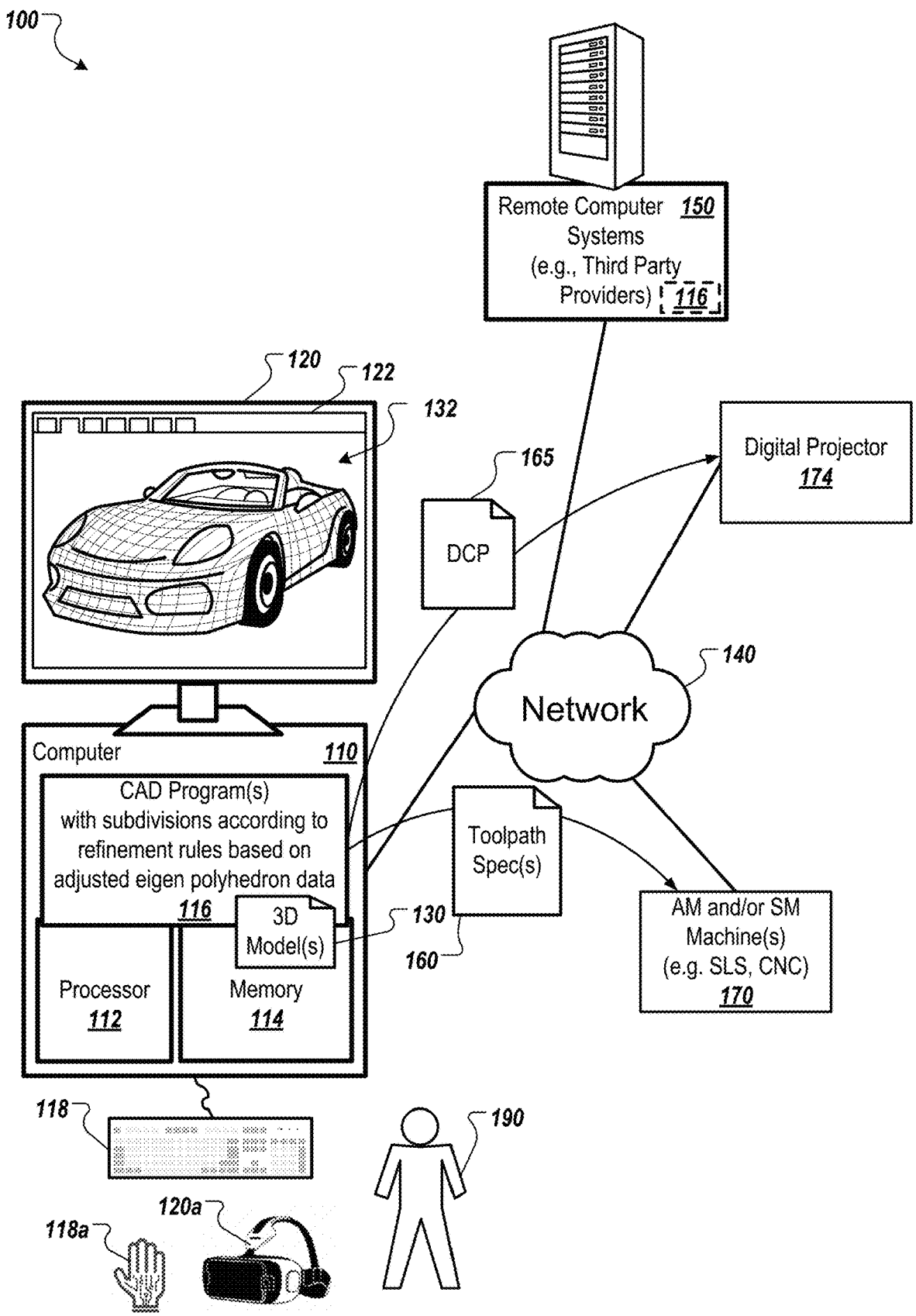
FIG. 1 shows an example of a system usable to generate a smooth surface for output from a refined control mesh that is produced by subdividing a control mesh using eigen polyhedron data and adjustment rules to adjust a set of face and edge points during subdivision

FIG. 1 shows an example of a system 100 usable to generate a smooth surface for output from a refined control mesh that is produced by subdividing a control mesh using eigen polyhedron data and adjustment rules to adjust a set of face and edge points during subdivision. A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112, including CAD program(s) 116, which implement three-dimensional (3D) modeling functions, including a subdivision technique that produces a curvature continuous limit surface by subdividing a polygonal control mesh according to refinement rules based on eigen polyhedron data and adjustment rule.

As used herein, CAD refers to any suitable program used to design physical structures that meet specified design requirements, regardless of whether or not the program is capable of interfacing with and/or controlling specific manufacturing equipment. Thus, CAD program(s) 116 can include CAD program(s), CAE program(s), CAM program (s), etc. The program(s) 116 can run locally on computer 110, remotely on a computer of one or more remote computer systems 150 (e.g., one or more third party providers' one or more server systems accessible by the computer 110 via the network 140) or both locally and remotely. Thus, a CAD program 116 can be two or more programs that operate cooperatively on two or more separate computer processors in that a program 116 operating locally at computer 110 can offload processing operations (e.g., subdivision surface, NURBS and NURCCS processing, adjustments to subdivision operations, etc.) "to the cloud" by having one or more programs 116 on one or more computers 150 perform the offloaded processing operations.

The CAD program(s) 116 present a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer (e.g., a touch screen can be an input/output device 118, 120). Moreover, the computer 110 can include or be part of a virtual reality (VR) or augmented reality (AR) system. For example, the input/output devices 118, 120 can include a VR/AR input glove 118a and/or a VR/AR headset 120a.

As noted above, the CAD program(s) 116 implement 3D modeling functions, which means a 3D model 132 can be built using the CAD program(s) 116. The CAD program(s) 116 can implement physical simulation (locally and/or by remote procedure call) to assist in building the 3D model 132. Physical simulations, such as finite element analysis (FEA), Computational Fluid Dynamics (CFD), Acoustics/Noise Control, thermal conduction, and/or computational injection molding simulations are often integral components in CAD-based product development. The CAD program(s) 116 can be used to build precise geometric descriptions of the design model, while physical simulations enable improved performance without time consuming physical testing.

The CAD program(s) 116 can provide user interface elements that enable the user to specify inputs for physical simulation(s), such as materials and loading cases for the 3D model(s) 132, where the loading cases define loads in different directions to be borne by a part being designed during use of the part. Thus, a user 190 can interact with the UI 122 of the CAD program(s) 116, including producing a full mechanical problem definition for a part to be manufactured, so as to build and modify 3D model(s) 132, which can be stored in 3D model document(s) 130. In the example of FIG. 1, the 3D model 132 is of a specific car design, but this is merely one of many possible 3D models that can be designed using the systems and techniques described herein.

In the example shown, the 3D model 132 rendered to the display device 120 in the UI 122 shows both the refined control mesh and smooth surfaces generated therefrom. As described in further detail below, the smooth surface for the 3D model 132 is generated from a refined control mesh that is generated by subdividing a control mesh. The subdivided control mesh includes an extraordinary point (uniform or non-uniform). The control mesh can be subdivided using data defining an eigen polyhedron and adjustments to face and edge point in accordance with implementations of the present disclosure. The smooth surface that is generated is a limit surface having at least C1 continuity. As used herein, an "extraordinary region" refers to a portion of a polygonal control mesh that includes an extraordinary point or an N-gon region.

An extraordinary point is (1) a vertex on the control mesh where n control polygon faces meet, in the mesh interior, and n is not equal to four, and also (2) a vertex on the control mesh where n control polygon faces meet, at the mesh boundary, and n is greater than two. An extraordinary point may be associated with a "star point." The "star point" can be defined as a corresponding point on the limit surface where (1) n surface patches meet, in the surface interior, and n is not equal to four, and/or (2) n surface patches meet, at the surface boundary, and n is greater than two. Further, an "N-gon" refers to a control polygon of the subdivision surface control mesh with N vertices with N not being equal to four. Both extraordinary points and n-gons in the control mesh lead to star points on the limit surface.

In some implementations, computer graphic applications (e.g. CAD program(s) 116) can represent objects (e.g., manufacturable objects) though models of complex surfaces. Such models include for example, NURCCS surfaces and NURBS surfaces. The models of complex surfaces can be presented as polygonal control meshes that are an approximation of a continuous representation of the manufacturable objects. Such models can be defined with meshes that have different levels of refinement. In some implementations, a model may have some region where the mesh is finer and some other region where the mesh is coarse. A refinement of the control mesh can be created by using refinement rules for the control points (e.g., a vertex, an edge point that lies on an edge of the mesh connecting control points, or a face point that lies in the center of faces of a mesh) of a patch region of a mesh to generate a refined control mesh. The refinement of the control mesh can be determined by subdivision(s) that are based on the eigen polyhedron data and further adjustment rules to generate a refined control mesh. Such subdivision(s) can be compatible with NURCCS and NURBS surfaces.

In some implementations, refinement rules that can be used for non-uniform surfaces (e.g., NURCCS and NURBS surfaces) may result in undesirable features. For example, refining a NURBS surface in a non-uniform region of an extraordinary point may result in surface tangent discontinuities. Extraordinary points in control meshes are vertices having a valence number different than four (i.e., having less than or greater than four adjacent edge points). In some implementations, surface tangent discontinuities introduce undesirable features, such as cusps, into a surface model that distort the object represented by the surface. In some implementations, e.g., in a NURCCS surface, subdivisions can result in generation of two or more local maximums from a mesh that has only a single local maximum.

In some implementations, subdivision of the control mesh in an area around an extraordinary point (i.e., an extraordinary point in a non-uniform surface) that restrict collapsing of the region of the mesh to a line under subdivision supports avoidance of undesired features. For example, an undesired feature may be to achieve two or more local maximums when subdividing the control mesh. In some implementations, data for an eigen polyhedron around an extraordinary point can be generated and used to define a refinement matrix and to perform a subdivision operation on the control mesh to subdivide according to the refinement matrix.

In some implementations, an eigen polyhedron can be defined for Catmull-Clark subdivisions and for uniform NURBS subdivisions. Eigen polyhedron data can be generated to represent a two-dimensional mesh including an extraordinary point as an initial vertex in a plane and a plurality of initial edge points in the plane, where the initial edge points are arranged in the plane with respect to the initial vertex based on a valence number of the initial vertex. Eigen polyhedron can be determined for an extraordinary point when the first knot intervals for first edges and second knot intervals for second edges are equal.

In some implementations, a polyhedron P is an eigen polyhedron of a subdivision affine mask M that represents an area local to an extraordinary point geometry if MP produces a scale of P by a factor λ followed by a translation T. In some implementations, polyhedron P can be repeatedly refined by M to avoid the collapse of control polygon faces (e.g., quads) and thus prevent non-uniform scaling leading to surface defects, for example, two local maximum points.

In some implementations, data for an eigen polyhedron defined around an extraordinary point can be used together with adjustment rules to define refinements of a control mesh that includes a non-uniform extraordinary point. In some implementations, refining a model of a complex surface (e.g., uniform or non-uniform) can be provided by using the data defining an eigen polyhedron around an extraordinary point and adjustment rules to generate the refined control mesh. A subset of face and edge points for faces around the extraordinary point as defined in the data for the eigen polyhedron can be adjusted according to the adjustment rules to generate the refined control mesh. Based on refining by using the data defining the eigen polyhedron and the adjustment rules, first knot intervals (di) for first edges and second knot intervals (ei) for second edges become equal to each other (within a numerical precision used by the computer graphics application) within a single subdivision of the one or more subdivisions done for the polygonal control mesh to produce the refined control mesh. The first edges are directly connected with the extraordinary point and are inside a region corresponding to the eigen polyhedron at the parameterized two-dimensional space, and the second edges are directly connected with the first edges and are outside the region corresponding to the eigen polyhedron at the parameterized two-dimensional space.

When subdivisions are based on data for an eigen polyhedron around an extraordinary point in a control mesh (e.g., uniform or non-uniform mesh in a three-dimensional space) and adjustment rules for face points and edge points at corresponding face and edge spaces, a generated refined control mesh defines a smooth surface, e.g. a limit surface, that has at least C1 continuity, i.e., the first derivative is continuous. The control mesh, which is refined, can be defined in the computer using different smooth surface modelling formats. For example, the control mesh can include NURBS, T-Splines, SubDiv, and Catmull-Clark surfaces, among other continuous surfaces.

In some implementations, the refined mesh represents a surface model that has continuous tangent planes in a region around the extraordinary point in the refined mesh. In such manner, the provided smooth surface is defined with improved accuracy. Improvements in the accuracy of the surface model of an object may also provide improvements for the manufacturing process of the object based on such a surface model.

In some implementations, the user 190 is enabled by the CAD program(s) 116 to both create and edit polygon control meshes, and generate iteratively refined control meshes by the CAD program(s) 116 based on adjustment rules defined in relation to data defining an eigen polyhedron around an extraordinary point of the control mesh at a previous iteration.

In addition, in some implementations, the CAD program(s) 116 may implement manufacturing control functions. Once the user 190 is satisfied with a 3D model 132, the 3D model 132 can be stored as the 3D model document(s) 130 and/or used to generate another representation of the model (e.g., an .STL file for additive manufacturing). This can be done upon request by the user 190, or in light of the user's request for another action, such as sending the 3D model 132 to additive manufacturing (AM) machine(s) and/or subtractive manufacturing (SM) machine(s) 170, or other manufacturing machinery, which can be directly connected to the computer 110, or connected via a network 140, as shown. This can involve a post-process carried out on the local computer 110 or a cloud service to export the 3D model 132 to an electronic document from which to manufacture. Note that an electronic document (which for brevity will simply be referred to as a document) can be a file, but does not necessarily correspond to a file. A document may be stored in a portion of a file that holds other documents, in a single file dedicated to the document in question, or in multiple coordinated files.

In any case, the CAD program(s) 116 can provide a document 160 (having toolpath specifications of an appropriate format) to an AM and/or SM machine 170 to produce a physical structure corresponding to at least a portion of the 3D model 132. An AM machine 170 can employ one or more additive manufacturing techniques, such as granular techniques (e.g., Powder Bed Fusion (PBF), Selective Laser Sintering (SLS) and Direct Metal Laser Sintering (DMLS)), extrusion techniques (e.g., Fused Deposition Modelling (FDM), which can include metals deposition AM). In some cases, the AM machine 170 builds the physical structure directly, and in some cases, the AM machine 170 builds a mold for use in casting or forging the physical structure. In addition, the user 190 can save or transmit the 3D model 132 for later use. For example, the CAD program(s) 116 can store the document(s) 130 that includes the 3D model 132.

An SM machine 170 can be a Computer Numerical Control (CNC) milling machine, such as a multi-axis, multi-tool milling machine used in the manufacturing process. For example, the CAD program(s) 116 can generate CNC instructions for a machine tool system 170 that includes multiple tools (e.g., solid carbide round tools of different sizes and shapes, and insert tools of different sizes that receive metal inserts to create different cutting surfaces) useable for various machining operations. Thus, in some implementations, the CAD program(s) 116 can provide a corresponding document 160 (having toolpath specifications of an appropriate format, e.g., a CNC numerical control (NC) program) to the SM machine 170 for use in manufacturing the physical structure using various cutting tools, etc.

In some implementations, the CAD program(s) 116 provide instructions to build a workpiece in a first stage of manufacturing, e.g., using direct AM and/or using forging and/or casting methods, and the CAD program(s) 116 also provide instructions to machine the workpiece, e.g., roughing and/or finishing operations, in a second stage of manufacturing, e.g., in a 3-axis CNC milling system, in order to form the completed structure. In general, various different manufacturing systems and techniques can be employed, either alone or in combination, to produce a final structure, and the CAD program(s) 116 can include suitable algorithms to generate toolpath specifications 160 for one or more of these various systems to manufacture a part that has been designed using the systems and techniques described in this application.

In addition, in some implementation, no physical manufacturing is involved. The systems and techniques described herein are applicable to any suitable surface modelling software. Thus, in some implementations, the CAD program (s) 116 can be animation production programs that render the 3D model 132 to a document 165 of an appropriate format for visual display, such as by a digital projector 174 (e.g., a digital cinema package (DCP) 165 for movie distribution) or other high resolution display device. In some other examples, the CAD programs(s) 116 can be video production software that render the 3D model 132 and/or other models generated by the CAD program(s) 116 as part of a rendered scene or frame. Other applications are also possible.

Figure 2:
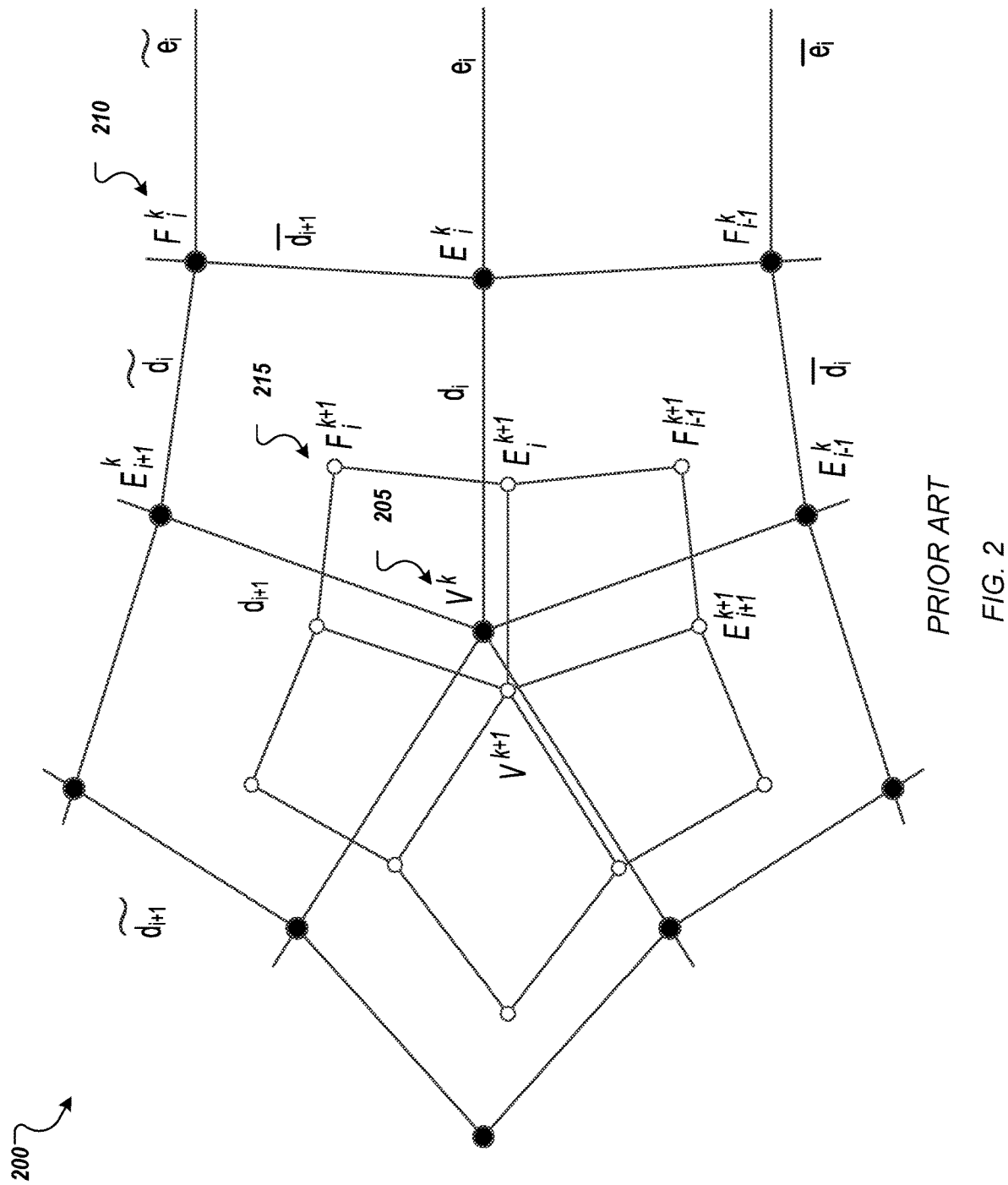
FIG. 2 shows an example polygonal control mesh for a smooth surface having an extraordinary point.

FIG. 2 shows an example polygonal control mesh 200 for a smooth surface having an extraordinary point. The polygonal control mesh 200 can be uniform control mesh or non-uniform at a region around an extraordinary point. The polygonal control mesh 200 is a 3D mesh that includes control points. The polygonal control mesh 200 defines a smooth surface and can be stored in different formats, e.g., a NURBS surface, a Catmull-Clark surface, a T-Spline surface, etc. The polygonal control mesh 200 includes a vertex $V^k$ 205 with a valence number equal to five (i.e., five (5) edges going out of the vertex). Thus, the vertex $V^k$ 205 is an extraordinary point. The extraordinary point can be a uniform or a non-uniform point depending on whether the knot intervals for first and second edges of the control mesh 200 are equal or not. For example, if the example polygonal control mesh 200 undergoes a refinement operation, control points from the polygonal mesh at an iteration k are transferred to control points of the refined mesh at an iteration (k+1). The control points in the polygonal control mesh 200 at the iteration k are represented with filled circles, while control points in the refined control mesh at iteration (k+1) are represented with open circles. The vertex at iteration k is denoted $V^k$ 205 and the vertex at iteration (k+1) is denoted as $V^{k+1}$. There are five (5) adjacent edge points at iteration k that are denoted $E_i^k$, where i corresponds to a consecutive number of an edge coming out of the vertex point $V^k$ 205, and i=0, 1, . . . , 4. There are five (5) face points defined at iteration k that are denoted as $F_i^k$ 210, and i=0, 1, . . . , 4, and five (5) face points defined at iteration k+1 that are denoted as $F_i^{K+1}$, and i=0, 1 . . . 4.

Knot intervals are arranged between various points of the polygonal control mesh 200 and are denoted in FIG. 2 with $d_i$, $\tilde{d}_i$, $\bar{d}_i$, $e_i$, $\tilde{e}_i$, and $\bar{e}_i$. The knot intervals that are between points on faces (polygons) around the vertex point include intervals denoted as: $d_i = |V^k E_i^k|$, $\tilde{d} = |F_i^k E_{i+1}^k|$, $\bar{d}_i = |F_{i-1}^k E_{i-1}^k|$. The first knot intervals are between the vertex and each of the first edges $E^k$ and are denoted as follows: $d_i = |V^k E_i^k|$. A corresponding set of knot intervals are defined for faces that are adjacent to faces around the vertex point, i.e., first level neighbor faces to the faces around the vertex point $V^k$. This set of second knot intervals is denoted as $e_i$, $e_{\tilde{i}}$, $e_{\bar{i}}$, as presented in FIG. 2. The second knot intervals $e_i$ are defined between first and second edges, where the second edges are directly connected to first edges and are outside the faces around the vertex point.

In a general non-uniform control mesh, the first and second knot intervals can be different (i.e., $d_i \neq e_i$). There are examples where the knot intervals may all be equal, such as in Catmull-Clark surfaces. However, there are other examples, e.g., NURBS surfaces, that are not limited to having equal knot intervals for first and second edges.

The polygonal control mesh 200 can be presented as a mesh matrix that is a (2n+1)×3 dimension matrix denoted as $P^k = [F_0^k, \ldots, F_4^k, E_0^k, \ldots, E_4^k, V^k]^T$. The polygonal control mesh 200 can be refined in iterations, where a refinement operation can be a linear operation based on the coordinates of the points in the spatial mesh at a given iteration. A subdivision mask can be generated that can scale and translate the point based on mathematically defined refinement rules as a matrix operation that can be defined as: $P^k = MP^{k-1} = M^k P^0$, where M is a refinement matrix defining a refinement operation for a given iteration.

NURBS and NURCCS provide refinement rules for subdividing the control mesh. However, conventional refinement rules may lead to discontinuities in the tangent at the vertex $V^k$ of the control mesh 200. Therefore, refinement rules for smooth surfaces having an extraordinary point, which can be either uniform or non-uniform, can be generated and used to produce a refined control mesh and thus to generate a smooth surface having at least C1 continuity. In accordance with implementations of the present disclosure, generation of refinement rules can involve defining an eigen polyhedron around an extraordinary point in a control mesh and adjusting face and edge points during refinement to achieve uniform extraordinary points. Data for the eigen polyhedron can be used to define subdivisions for a control mesh to refine the mesh and to avoid surface tangent discontinuities for the generated smooth surface.

In the context of subdivision of a control mesh to generate a refined control mesh over one or more iterations, a transformation matrix can be defined as subdivision rules, and the transformation matrix may define eigen vectors and eigen values. An eigen vector can be defined as a position of points to be subdivided. An eigenvalue of that eigen vector can describe the change in the length of the eigen vector.

Figure 3:
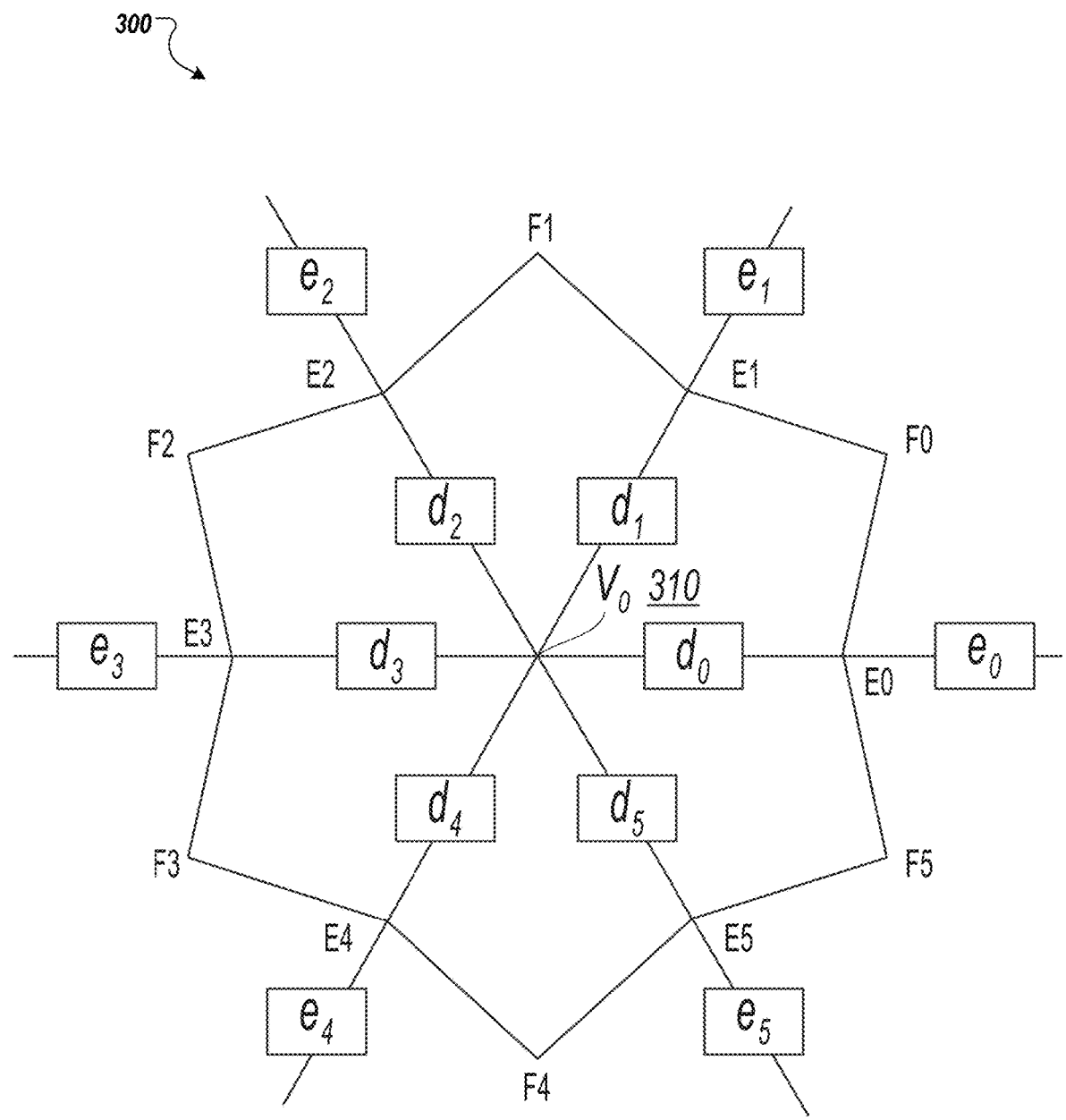
FIG. 3 shows an example eigen polyhedron used to determine adjustment rules for subdividing a polygonal control mesh in accordance with implementations of the present disclosure.

FIG. 3 shows an example eigen polyhedron 300 used to determine adjustment rules for subdividing a polygonal control mesh in accordance with implementations of the present disclosure. The eigen polyhedron 300 has six edges that are arranged counter-clockwise starting from the x axis. Each edge point is identified with $E_i$, where i=0, 1, . . . , 4. The eigen polyhedron 300 has a vertex point V0 310 that is an extraordinary point in the control mesh and corresponds to a star point on the limit surface. The vertex point V 310 is defined to have coordinates of (0,0) in the plane. The eigen polyhedron is defined in the eigen space, which is a two dimensional space, and the edge point $E_0$ is on the x-axis of the plane. The valence number of the vertex point is 6. Each edge point has a knot interval. The indices defined for the knot intervals correspond to the indices of the edges (e.g., $d_i$ is the interval of $\hat{E}_i$).

In some implementations, eigen polyhedron 300 can be generated as a plane mesh in a two-dimensional space that include an extraordinary point as an initial vertex in a plane. Data can be generated for the eigen polyhedron 300 that defines control points of the mesh, including initial edge point data, initial face point data, and initial vertex data.

In some implementations, an eigen polyhedron structure of a particular refinement subdivision matrix can be defined, where the eigen polyhedron has the characteristics to retain its shape when subdivided, except for being scaled (e.g., by a constant) and translated (e.g., by a translation vector). In some instances, scaling can be performed based on a scaling factor that is maintained the same during subdivisions, and the scaling factor can be determined based on the valence number. In some instances, translation can be performed based on the same translation vector for subdivisions following a subdivision where the knot intervals for the first and second edges are defined as equal. For an eigen polyhedron mesh structure to exist, the matrix has to have two eigen vectors with the same eigen value. Therefore, an eigen polyhedron structure requires that knot intervals for first and second edges are equal to be able to support improved features of the subdivision scheme to correct surface defects at extraordinary points. For example, Catmull-Clark subdivisions and some cases of NURBS schemes may have an eigen polyhedron. When a given subdivision scheme does not have an eigen polyhedron, a star point of the smooth surface collapses to a line and this results in poor quality of representation of the smooth surface.

NURCCS and NURBS also use the next knot interval out of the region around the extraordinary point (i.e., $e_i$), and eigen polyhedron structures require $d_i = e_i$ in order to support continuous continuity during subdivision. Thus, consistent definitions for executing subdivisions based on adjustment rules are provided to maintain continuous continuity during subdivision, where such definitions can be applied to any control polygonal mesh without the required $d_i = e_i$ as a prerequisite. In some implementations, if a control mesh does not include equal first knot intervals and second knot intervals (i.e., does not meet a prerequisite for an eigen polyhedron to exist), a preliminary subdivision may be necessary to arrive at a schema where this prerequisite for an eigen polyhedron is met and the eigen polyhedron subdivision rules can be applied without further adjustments. However, determining a preliminary subdivision that would yield a control mesh that complies with those requirements may be difficult to achieve.

In some instances, when subdivisions are performed, a subdivision scheme can be determined in such a way that the shape of the area in the control mesh around an extraordinary point can be subdivided to arrive at an eigen polyhedron structure within a single subdivision. In cases where the control mesh includes an N-gon, an extraordinary point can be defined at a first subdivision step and one more subdivision can be applied to arrive at an eigen polyhedron structure around the determined extraordinary point within the N-gon. By using data for the eigen polyhedron and a subdivision scheme that scales and translates an arbitrary uniform structure to an eigen polyhedron, the subdivisions can be backward-compatible with Catmull-Clark rules and NURBS rules. In some implementations, positions of control points of the polygonal mesh can be input to an algorithm to calculate subdivision rules to generate a refined mesh for the smooth surface that is compatible with both NURBS and NURCCs subdivision rules.

In some implementations, eigen-polyhedron-derived subdivision rules can be used to correct surface defects (such as peaks and troughs) around extraordinary points (e.g., associated with a degree (or a valence number) n) when generating a smooth surface. These eigen polyhedron subdivision rules can use a stationary affine subdivision mask, M, that is local to an extraordinary point's geometry, to stably subdivide the underlying blending functions associated with the control mesh. The subdivision mask M (which is a refinement matrix for generating a refined control mesh) can scale and translate eigen polyhedron points $P^{k-1}$ to points $P^k$ such that $$P^k = MP^{k-1} = M^k P^0 = \lambda^k P^0 + (1+\lambda+\ldots+\lambda^{k-1})IT^0, \quad (1)$$

where $P^k$ is a two-dimensional eigen polyhedron at subdivision level k defined by $$P^k = [F_0^k, \ldots, F_{n-1}^k, E_0^k, \ldots, E_{n-1}^k, V^k]^T \in \mathbb{R}^{(2n+1) \times 2}, \quad (2)$$

for an extraordinary point of valence n with face and edge points given by $F_i^k$ and $E_i^k$ for $i \in \{0, \ldots, n-1\}$, vertex point $V^k$ such that $T^0 := V^1$ with $V^0 := [0,0]$, and where $\lambda$ is an eigenvalue of the subdivision matrix M.

In some implementations, eigen polyhedron can be constructed for any eigenvalue, $\lambda$, of the Catmull-Clark refinement matrix M that has an algebraic multiplicity of two. For example, an eigen polyhedron can be constructed as a function of the extraordinary point's valence n, for the eigenvalue defined at formula (3):

$$\lambda = \frac{1+\gamma}{4\gamma} = \frac{5 + c_n + \sqrt{(c_n+9)(c_n+1)}}{16}, \quad (3)$$

$$\gamma = \frac{4}{1 + c_n + \sqrt{(c_n+9)(c_n+1)}}, \quad (4)$$

with $\gamma$ defined by
where $c_n = \cos(2\pi/n)$. In the eigen polyhedron 300, the angles between the edges are equal and can be defined by the constant $$\theta = \frac{\tau}{n}, \quad (5)$$

where $\tau = 2\pi$ and n is the valence of the extraordinary point (in the example 300 this is equal to 6). The angle between two arbitrary edges (also called spokes) can be defined by $$\theta_{i,j} = \sum_{k=i}^{j-1} \theta_k, \quad i < j, \quad (6)$$

for $i \in \{0, \ldots, n-1\}$ and $\theta_k := \theta$ from (3). A spoke of the $P^0$ eigen polyhedron 300, which corresponds to the vector $V^0 E_i^0$, can be defined by $$E_i^0 = l_i[\cos \theta_{0,i}, \sin \theta_{0,i}], \quad (7)$$

where $l_i$ is the length of a spoke defined as $$l_i = |E_i - V^0| = d_i + d_i^+ + d_i^-, \quad (8)$$

where $d_i$ is the per-spoke inner knot, and dt and care the per-spoke local and opposite knots defined by $$d_i^+ = \frac{\sum_{j=i}^{i+n-1} d_j \max(0, \cos \theta_{i,j})}{\sum_{j=i}^{i+n-1} \max(0, \cos \theta_{i,j})}, \quad (9)$$

$$d_i^- = \frac{\sum_{j=i}^{i+n-1} d_i \min(0, \cos \theta_{i,j})}{\sum_{j=i}^{i+n-1} \min(0, \cos \theta_{i,j})}. \tag{10}$$

Equations (7) and (8) are associated with NURBS and/or Catmull-Clark surfaces (i.e., CCNURBS) eigen polyhedron spoke-edge lengths, where (i) the valence of the extraordinary point is four and $d_i = \bar{d}_i = \tilde{d}_i$ and $e_i = \tilde{e}_i = \bar{e}_i$ or (ii) the inner knots, $d_i = d_j$ for all i, j, and $d_i$ is equal to the outer knot, $e_i$, for i, j∈ {0, ..., n−1}. It can be appreciated that even though the eigen polyhedron 300 is represented as having equal-length edges, the edges can be of different length. Defining a coordinate system in the plane, $\mathbb{R}^2$, centered at $V^0 := [0,0]$ such that $E_0^0 := [l_0, 0]$, the initial eigen polyhedron, $P^0$, is defined by the edge points from (7), the vertex point, $V^0 := [0,0]$, and face points, $$F_i^0 = \gamma(E_i + E_{i+1}), \tag{11}$$

where it is understood that the modulo n-th operation for a corresponding face point or edge point is applied to the index (i+1).

The face points defined by (11) can be computed, where the n edge points and face points are labeled using a counter-clockwise labeling of the n edges and face points, as presented on FIG. 3.

Eigen polyhedron rules for performing subdivisions can define how to scale and translate the eigen polyhedron to a next iteration of a refined control mesh while maintaining the shape of the eigen polyhedron. The eigen polyhedron edge and face point rules can be produced as 2D coordinates in a plane, and can be defined as linear combinations of control points of the control mesh. The face and edge point rules can be derived by performing inverse bilinear interpolation to determine which parametric (u, v) points would correspond to given face and/or edge points.

In some implementations, eigen polyhedron rules can be generated for face, edge, and vertex points, and can be used to perform subdivisions to a control mesh. In cases where the control mesh is uniform around an extraordinary point, subdivisions based on eigen polyhedron rules may lead to generating a smooth surface. In some instances, traditional eigen polyhedron subdivision rules may require that the first and second knot intervals around an extraordinary point are equal such that $d_i = e_i$ for all i∈ {0, ..., n−1}. For example, traditional eigen polyhedron can be determined using the techniques described in U.S. Pat. No. 10,249,086 to Sederberg, which is hereby incorporated by reference.

Since non-uniform extraordinary points are defined by the condition that $d_i \neq e_i$ for at least one value of i, the traditional eigen polyhedron rules cannot be applied to a control mesh that is non-uniform around an extraordinary point. The traditional eigen polyhedron rules may be adjusted using one or more adjustment rules described in this specification to produce adjusted NURCCSs compatible eigen polyhedron rules, which can be applied to a control mesh that is either uniform or non-uniform around an extraordinary point. By making corrections to computed face, edge, and vertex points according to eigen polyhedron rules, after a single subdivision based on the adjusted rules, the refined control mesh can transform to a mesh where the first and second knot intervals become equal. Therefore, in a subsequent subdivision the adjusted subdivision rules can substantially correspond (or in full) to the traditional rules as the adjustment rules are based on the difference between the length of the first and second knot intervals ($d_i$, $e_i$) which results in zero since those first and second knot intervals become equal after the initial subdivision. When the first and second knot intervals are equal, the correction term corresponding to the adjustment reduces to zero (0) (or substantially zero), and even if subdivisions are performed based on the adjusted rules, those rules applied after a first subdivision can match the computations obtained if performed with traditional eigen polyhedron rules (e.g., rules defined for eigen polyhedron where the first and second knot interval are equal as a prerequisite).

Figure 4:
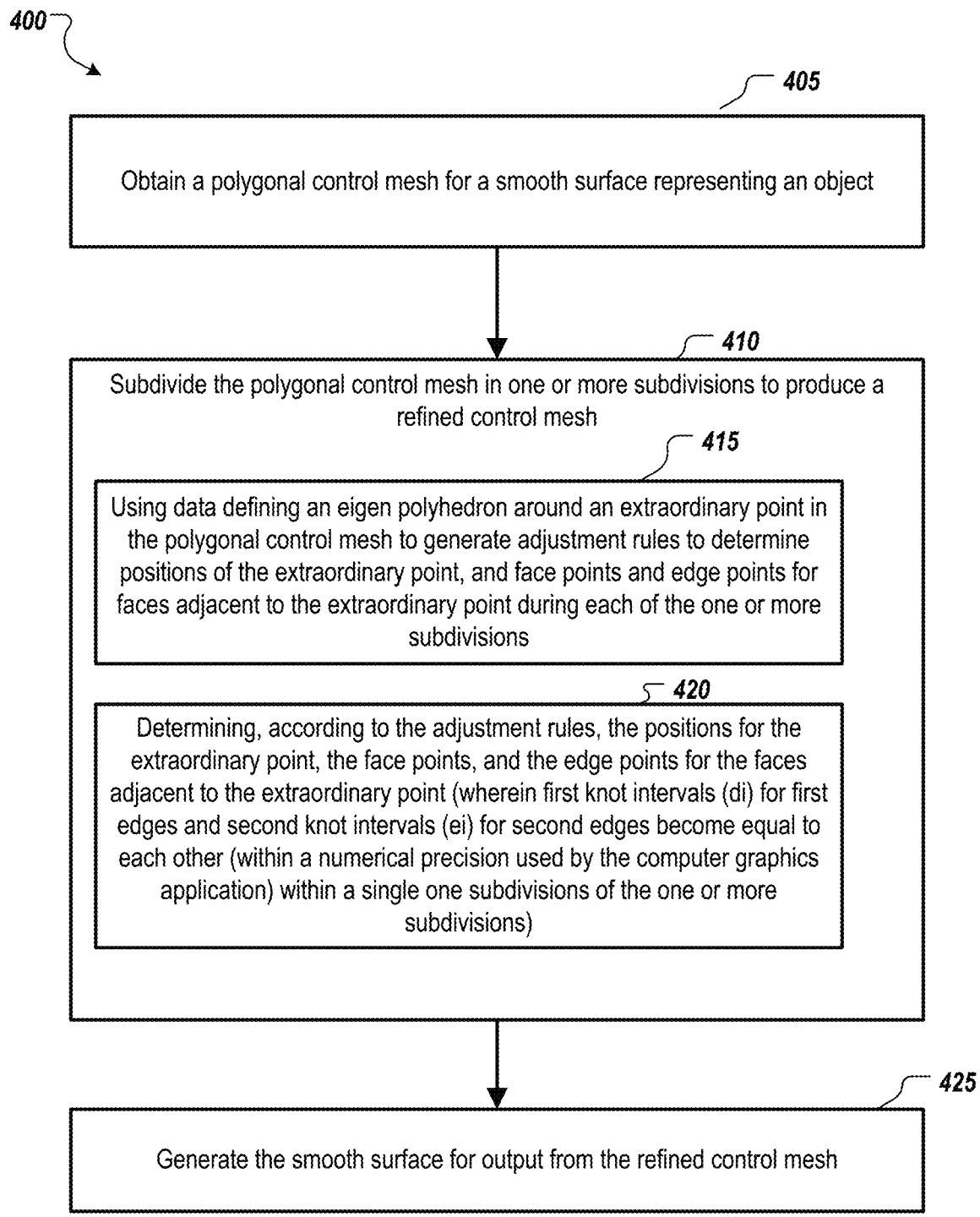
FIG. 4 shows an example of a process to produce a smooth surface from a refined control mesh based on subdivision(s) using data defining an eigen polyhedron around an extraordinary point in accordance with implementations of the present disclosure.

FIG. 4 shows an example of a process 400 to produce a smooth surface from a refined control mesh based on subdivision(s) using data defining an eigen polyhedron around an extraordinary point in accordance with implementations of the present disclosure. In some implementations, the process 400 can be executed using a computer graphics application 116 (e.g., CAD, CAE, CAM, video production software, animation programs, other). In some implementations, the computer graphics application can communicate with a manufacturing system, such as a CNC machine, or other subtractive manufacturing system or technique, for production of physical objects based on a generated smooth surface from the operations performed at process 400. In some more implementations, the computer graphics application can communicate with a digital projector (e.g., the digital projector 174 of FIG. 1) to provide a file (e.g., document of a particular expected format) that includes an output smooth surface from the process 400 for visual display at the display of the digital projector. In some implementations, the computer graphics application can be a video production software solution that renders a 3D model and/or other models generated by a computer graphics application as a result of process 400 as part of a rendered scene or frame.

At 405, a polygonal control mesh for the smooth surface is obtained. The smooth surface represents an object. In some implementations, the object can be a physical entity for manufacturing or an object for visual representation on a display device. The polygonal control mesh includes an extraordinary point that may be a uniform or non-uniform extraordinary point. In some implementations, the extraordinary point can be a non-uniform extraordinary point where the first knot intervals and the second knot intervals are not equal or can be a uniform extraordinary point where those intervals are equal. The control mesh can be subdivided in an area around the extraordinary point by using eigen polyhedron data and further adjustment rules to arrive at a subdivision that is compatible with NURBS and NURCCs subdivision rules. The subdivision of the area around the extraordinary point can be performed in accordance with the implementations of the present disclosure without an additional determination whether the extraordinary point is uniform or non-uniform to achieve a smooth surface with at least $C^1$ continuity.

At 410, the polygonal control mesh is subdivided according to one or more subdivisions to produce a refined control mesh. The refined control mesh can be created in iterations and based on data of the control mesh at a previous iteration. Subdivision(s) to the polygonal control mesh in accordance with the steps defined for the subdivision operation 410 can be performed without initial determination whether the extraordinary point is a uniform or a non-uniform extraordinary point. The subdivision(s) can be performed to generate a refined mesh to determine a smooth surface that has at least $C^1$ continuity. In some implementations, the subdivision(s) as performed according to operations 410 (including 415 and 420) are compatible with NURCCs and NURBS surfaces.

As part of the subdivision operation, at 415, data defining an eigen polyhedron around an extraordinary point in the polygonal control mesh is used. In some implementations, the data defining the eigen polyhedron includes data for face and edge points for faces around the extraordinary point. The eigen polyhedron data can be used to generate adjustment rules to determine positions of the extraordinary point, and face points and edge points for faces adjacent to the extraordinary point during each of the one or more subdivisions. The eigen polyhedron data can be adjusted based on adjustment rules to define a refined mesh that has equal first and second knot intervals after a single subdivision. Based on subdivision(s) according to adjusted subdivision rules, the control mesh can scale and translate faces around the extraordinary point to prevent the control mesh from collapsing to a line in the area of the extraordinary point.

At 420, positions for the extraordinary point, the face and edge points for faces around the extraordinary point are determined according to the adjustment rules. The adjustment rules can be defined for the extraordinary point, the face points, and the edge points at corresponding face and edge spaces. The adjustment rules can be applied to data defining the corresponding face and edge points from the data of eigen polyhedron. When subdivisions to the polygonal control mesh are performed based on defined face and edge points determined according to the adjustment rules and using the eigen polyhedron data, first knot intervals ($d_i$) for first edges and second knot intervals ($e_i$) for second edges of the area around the extraordinary point become equal to each other within a numerical precision used by the computer graphics application within a single subdivision of the one or more subdivisions. The first edges are directly connected with the extraordinary point and are inside a region corresponding to the eigen polyhedron at the parameterized two-dimensional space. The second edges are directly connected with the first edges and are outside the region corresponding to the eigen polyhedron at the parameterized two-dimensional space.

In accordance with the implementations of the present disclosure, by subdividing a polygonal control mesh in an area around an extraordinary point, even if the extraordinary point is non-uniform, within one subdivision, the generated refined mesh would yield an eigen polyhedron structure. Therefore, even if the initial polygonal mesh does not have equal first and second knot intervals for first and second edges, as required to achieve an eigen polyhedron structure, such structure is generated within a single subdivision based on the face and edge points determined according to the adjustments performed at 420.

In some more implementations, determining the positions of face points and edge points for the faces around the extraordinary point includes calculating adjusted face points and edge points for the faces around the extraordinary point based on applying the adjustment rules to positions of face points and edge points as provided in the data defining the eigen polyhedron. In some implementations, an adjusted face point can be calculated for a corresponding face according to the adjustment rules and the data defining the eigen polyhedron. In some cases, an adjusted face point rule can be applied to adjust a value determined for a given face point from the data defining the eigen polyhedron. In some implementations, adjustments to a face point can be calculated as discussed in relation to FIGS. 5A and 5B, and FIG. 6.

In some implementations, an adjusted edge point can be calculated at a corresponding edge according to the adjustment rules and the data defining the eigen polyhedron. In some cases, an adjusted face point rule can be applied to adjust a value determined for a given edge point from the data defining the eigen polyhedron. In some implementations, the adjustments to face points and edge points as defined in the eigen polyhedron data is performed in the parametric space of the eigen polyhedron. In some implementations, adjustments to an edge point can be calculated as discussed in relation to FIGS. 5A and 5B and FIG. 6.

Figure 6:
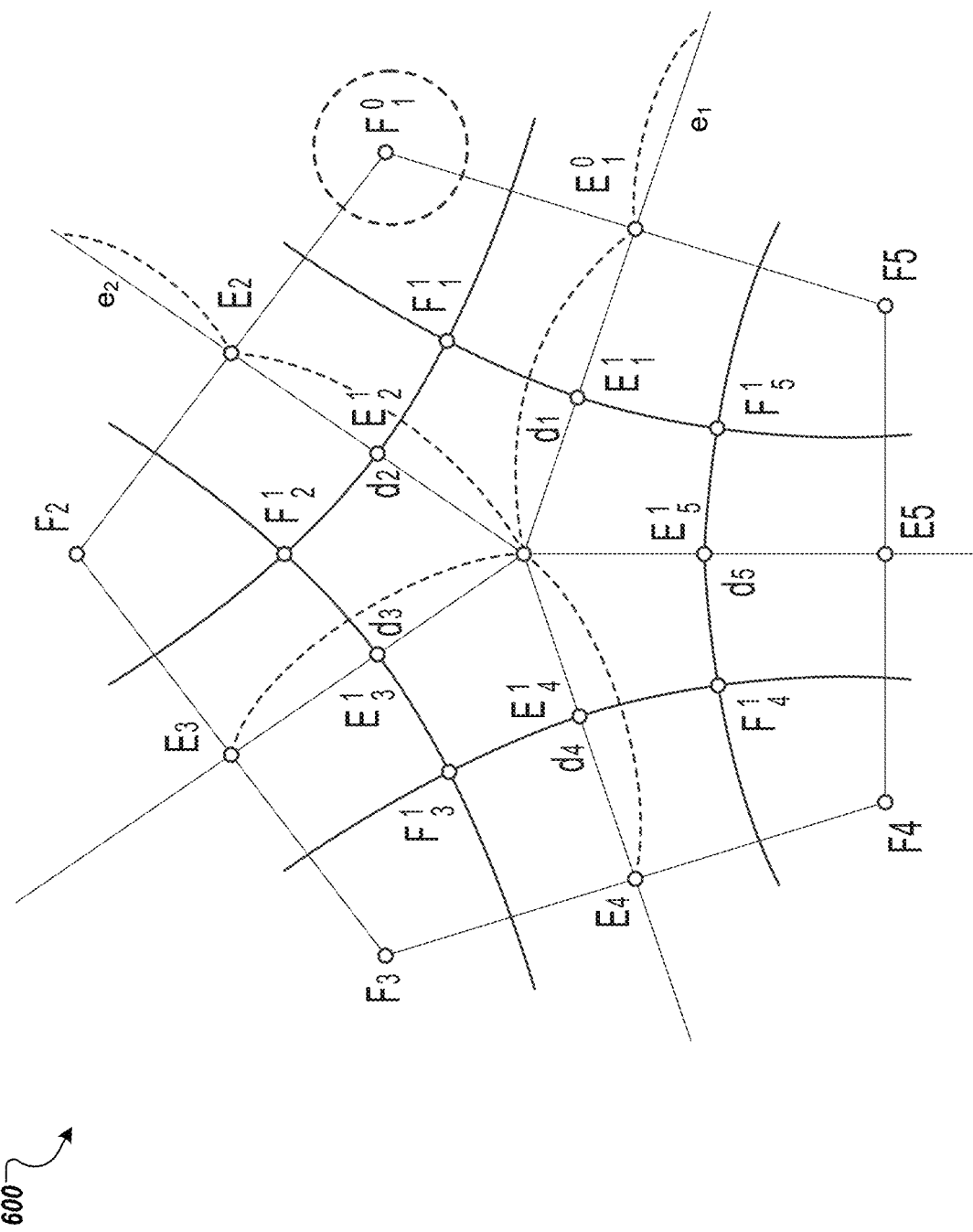
FIG. 6 shows a diagram presenting subdividing a polygonal control mesh around an extraordinary point based on refinement rules in accordance with implementations of the present disclosure.

In some implementations, adjustment rules for determining face and edge points at corresponding face and edge spaces can be determined as discussed in relation to FIG. 6. In some implementations, adjustment rules can be applied to the calculations of a vertex point for determining a subsequent vertex point for a subdivided control mesh. In some implementations, the determination of the positions 420 can include converting the adjusted face and edge points into refinement rules for determining face and edge points on the polygonal control mesh to generate the refined control mesh.

At 425, the smooth surface is generated for output from the refined control mesh that is generated based on the subdivision(s) at 410. For example, the generated smooth surface can be used for manufacturing a physical object, e.g., using a CNC machine, and based on a toolpath specification that can be generated based on the smooth surface. In some other examples, the generated smooth surface may be rendered on a display interface of a display device. The rendered smooth surface may be integrated into an animation scene or a video production.

Figure 5A:
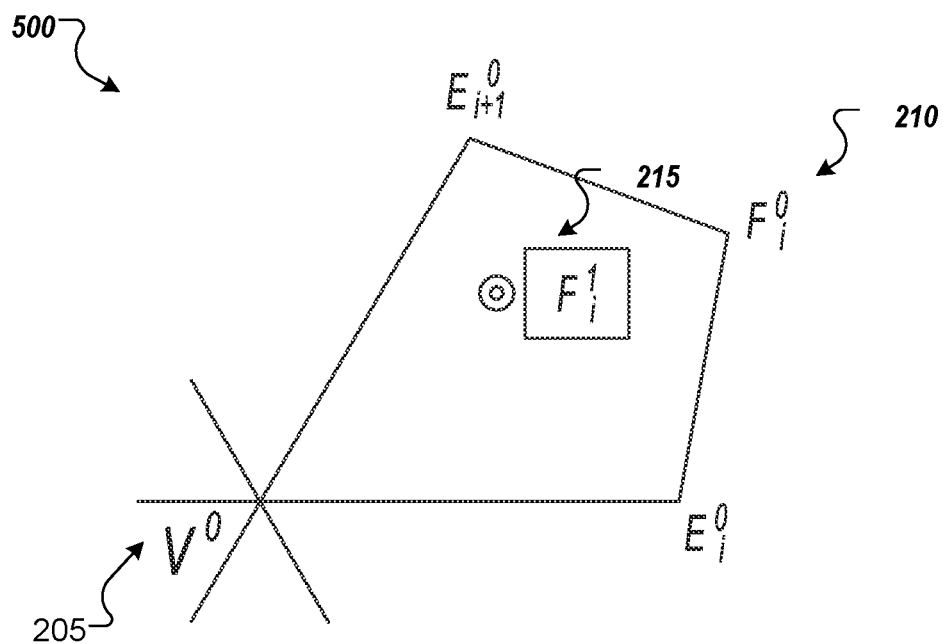
FIG. 5A shows a diagram presenting a derived face point based on an adjustment according to adjustment rules defined at a corresponding face space in accordance with implementations of the present disclosure.
Figure 5B:
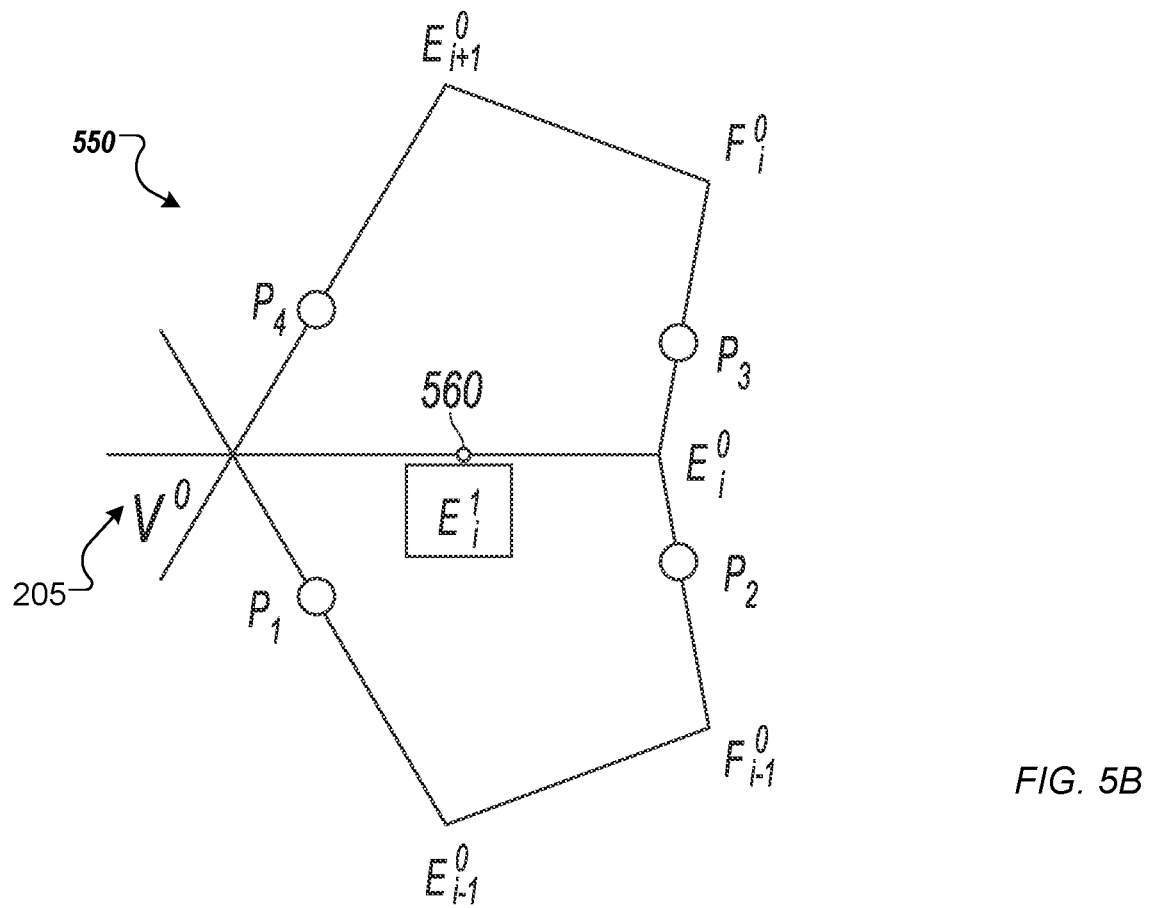
FIG. 5B shows a diagram presenting a derived edge point based on an adjustment according to adjustment rules defined at a corresponding edge space in accordance with implementations of the present disclosure.

In some implementations, eigen polyhedron subdivision rules can be defined for face, edge, and vertex points. FIG. 5A shows a diagram presenting a derived face point based on an adjustment according to adjustment rules defined at a corresponding face space in accordance with implementations of the present disclosure. FIG. 5B shows a diagram presenting a derived edge point based on an adjustment according to adjustment rules defined at a corresponding edge space in accordance with implementations of the present disclosure. Eigen polyhedron data, including data for a face point, edge point, and a vertex point, when the first and second knot intervals are equal, can be calculated. The eigen polyhedron data can be used for determining refined face points, edge points, and vertex point, that can be applicable in a general case where such prerequisite is not present. Such calculated refined point can be a result of adjusting eigen polyhedron data as discussed in connection with FIG. 4 in association with operation 410.

At FIG. 5A, a face 500 adjacent to an extraordinary point $V^0$ 205 is presented with a face point $F_i^1$ 215 computed for performing a subdivision. At FIG. 5B, an area 550 of two adjacent faces adjacent to an extraordinary point is presented with an edge point $E_i^1$ that is computed for performing a subdivision.

The eigen polyhedron face point rule can be derived by performing an inverse bilinear interpolation on the eigen polyhedron face point $$F_i^1 = V^1 + \lambda F_i^0, \qquad (12)$$
$$= V^1 + \lambda\gamma(E_i^0 + E_{i+1}^0),$$

and solving for (s, t) under the following bilinear interpolation $$F_i^1 = (1-s)(1-t)V^0 + s(1-t)E_i^0 + stF_i^0 + (1-s)tE_{i+1}^0.$$

For example, solving the bilinear interpolation can be performed using the techniques described in "Floater, M. S. 2015. The inverse of a bilinear mapping, Computer Aided Geometric Design 33, 46-50," which is hereby incorporated by reference.

By numerically solving for (s, t) in (13), the face point rule can be expressed as a function of the two dimensional points, $V^0$ 205, $E_i^0$, $F_i^0$, and $E_{i+1}^0$, as defined at (14):

$$F_i^1 = F_i^1(V^0, E_i^0, F_i^0, E_{i+1}^0), \quad (14)$$

which defines a map from the vertex, edge, and face points at a first subdivision level (e.g., zero) to the eigen polyhedron's face point at a subsequent subdivision level (e.g., level one). Since the eigen polyhedron subdivision matrix does not change (i.e., is stable) over subsequent subdivisions, the numerical solutions for $(s_i, t_i)$, where combinations of the numerical solutions are entries in the subdivision matrix M from (1), are stable and can be directly used to build a k'th face point subdivision rule, $F_i^k = F_i^k(V^{k-1}, E_i^{k-1}, F_i^{k-1}, E_{i+1}^{k-1})$.

In accordance with implementations of the present disclosure, to generalize the face point rule to be used in three dimensional space, substitutions can be made for the equivalent points of $V^{k-1}$, $E_i^{k-1}$, $F_i^{k-1}$, and $E_{i+1}^{k-1}$ in $\mathbb{R}^3$.

FIG. 5B represents two faces attached with an edge $V^0 E_i^0$. The eigen polyhedral edge point rule can be derived by performing a sequence of two separate inverse bilinear interpolations. From the definition of the eigen polyhedron edge point, $E_i^1$ 560 is defined according to:

$$E_i^1 = V^1 + \lambda E_i^0. \quad (15)$$

As presented on FIG. 5B, edge points are constructed as a linear combination of the six nearby vertices of the associated edge, $V^0$, $E_{i-1}^0$, $F_{i-1}^0$, $E_i^0$, $F_i^0$, and $E_{i+1}^0$. A bilinear space can be constructed based on the points $$P_0 = (1-s_{i-1})V^0 + s_{i-1}E_{i-1}^0 \quad (15a)$$

$$P_1 = (1-s_{i-1})E_i^0 + s_{i-1}F_{i-1}^0 \quad (15b)$$

$$P_2 = (1-t_i)E_i^0 + t_i F_i^0 \quad (15c)$$

$$P_3 = (1-t_i)V^0 + t_i E_{i+1}^0 \quad (15d)$$

where points $(s_i, t_i)$ and $(s_{i-1}, t_{i-1})$ are determined by solving the face point inverse bilinear interpolation problem of (13) for eigen polyhedron face points $F_i^1$ and $F_{i-1}^1$ generated using (12). Based on the points from the formulas (15a), (15b), and (15c), a subsequent bilinear space for determining the edge point can be defined such that the edge point rule can be determined by solving the inverse bilinear problem (16):

$$E_i^1 = (1-u)(1-v)\frac{P_0 + V^0}{2} + u(1-v)\frac{P_1 + V^0}{2} + uv\frac{P_2 + E_i^0}{2} + (1-u)v\frac{P_3 + E_i^0}{2}, \quad (16)$$

for (u, v) given the edge point $E_i^1$ generated from (14). By numerically solving for (u, v) in (15), the edge point rule can be expressed as a function of the six two dimensional points, $V^0$, $E_{i-1}^0$, $F_{i-1}^0$, $E_i^0$, $F_i^0$, and $E_{i+1}^0$, as $E_i^1 = E_i^1(V^0, E_{i-1}^0, F_{i-1}^0, E_i^0, F_i^0, E_{i+1}^0)$ which defines a map from vertex, edge, and face points at subdivision level zero to the eigen polyhedron's face point at subdivision level one. Since the eigen polyhedron subdivision matrix does not change (i.e., is stable) over subsequent subdivisions, the numerical solutions for $(s_i, t_i)$ $(s_{i-1}, t_{i-1})$, and combinations of which are entries in the subdivision matrix M from (1), are stable and can be directly used to build the k-th edge point subdivision rule, $E_i^k = E_i^k(V^{k-1}, E_{i-1}^{k-1}, F_{i-1}^{k-1}, E_i^{k-1}, F_i^{k-1}, E_{i+1}^{k-1})$. In accordance with implementations of the present disclosure, to generalize the edge point rule to a three dimensional space, substitutions are made for the six equivalent points of $V^0$, $E_{i-1}^0$, $F_{i-1}^0$, $E_i^0$, $F_i^0$, and $E_{i+1}^0$ in $\mathbb{R}^3$.

The vertex point rule for the vertex point $V^{k+1}$, as presented in both FIGS. 5A and 5B, can be defined by formula (17):

$$V^{k+1} = \frac{n-3}{n}V^k + \frac{3\sum_{i=1}^{n}(m_i H_i^k + f_i G_i^k)}{n\sum_{i=1}^{n}(m_i + f_i)}, \quad (17)$$

where $V^0 = [0, 0]$ and $$H_i^k = g_i E_i^k + \bar{g}_i V^k, \quad (18a)$$

$$G_i^k = \bar{g}_i \bar{g}_{i+1} V_i^k + g_i \bar{g}_{i+1} E_i^k + g_i g_{i+1} F_i^k + \bar{g}_i g_{i+1} E_{i+1}^k, \quad (18b)$$

$$f_i = \prod_{j=i+2}^{i+n-1} d_j^+, \quad (18c)$$

$$g_i = \frac{d_{i-2} + d_{i+2} + d_i}{d_{i-2} + d_{i+2} + 4d_i}, \quad (18d)$$

$$\bar{g}_i = (1 - g_i), \quad (18e)$$

$$m_i = f_i + f_{i-1}, \quad (18f)$$

FIG. 6 show a diagram presenting subdividing a polygonal control mesh 600 around an extraordinary point V based on refinement rules (such as the refinement rules presented in formulas (13), (16), and (17)) in accordance with implementations of the present disclosure.

The polygonal control mesh 600 is a general mesh that can be either uniform or non-uniform around the extraordinary point. When subdivisions are performed based on eigen polyhedron data, if the extraordinary point is non-uniform, then the discussed edge point, face point, and vertex point rules cannot be applied to scale and translate the mesh and arrive at a $C^1$ continuous surface. Therefore, to subdivide a general polygonal control mesh, either uniform or non-uniform, subdivision rules can be applied that are based on eigen polyhedron data and also based on corrections that adjust the determined eigen polyhedron face, edge, and vertex points in cases where the extraordinary point is non-uniform. The subdivision of the control mesh based on these adjustment rules and on eigen polyhedron data can be performed as discussed in FIG. 4, and further discussed in FIG. 8, where an extraordinary point is introduced on a N-gon face.

In some implementations, face point corrections, edge point corrections, and vertex point corrections can be derived as adjustments to the corresponding eigen polyhedron points. In some implementations, performing the corrections as described in the present disclosure can provide a unifying framework where the corrected eigen polyhedron points agree (or are otherwise compatible) with the points determined during the subdivision iterations and obtained using the NURCCs subdivision rules for non-uniform extraordinary points (i.e., $d_i \neq e_i$, $i \in \{1, \ldots, n-1\}$) and/or with the NURBS subdivision rules for non-uniform valence four extraordinary points during the first and all subsequent subdivisions. The adjustment rules can be determined by examining NURCCs refinement rules for non-uniform cubic B-splines surfaces under the restrictions $d_i \neq e_i$ and $d_i = e_i$.

In some implementations, corrections for the values of the face and edge points, and the vertex can be performed directly in the same parametric space $(s, t) \in [0,1] \times [0,1]$ of the eigen polyhedron face and edge point subdivision rules as defined in relation to FIGS. 5A and 5B and based on the adjustment rules defined below.

As shown on FIG. 6, the knot intervals along the x-axis are $[d_i^-, *, d_i, e_i]$ and along the y-axis are $[d_{i+1}^-, *, d_{i+1}, e_{i+1}]$, where * denotes the location of an extraordinary point. The NURBS face point rule can be generally represented at formula (20):

$$F_i^k = \frac{\begin{bmatrix} (d_{i+1} + 2e_{i+1})(d_i + 2d_i^-)E_i^{k-1} + (d_{i+1} + 2e_{i+1})(d_i + 2e_i)V^{k-1} + \\ (d_{i+1} + 2d_{i+1}^-)(d_i + 2e_i)E_{i+1}^{k-1} + (d_{i+1} + 2d_{i+1}^-)(d_i + 2d_i^-)F_i^{k-1} \end{bmatrix}}{4(d_{i+1}^- + d_{i+1} + e_{i+1})(d_i^- + d_i + e_i)} \quad (20)$$

In order to determine the adjustment rule for the eigen polyhedron's face point, a calculation of the face point when the extraordinary point is uniform, and not uniform, can be performed. Working directly in the underlying parametric space of $(s, t) \in [0,1] \times [0,1]$ where $V^0 = [0,0]$, $E_i^0 = [1,0]$, $E_{i+1}^0 = [0,1]$ and $F_i^0 = [1,1]$, the face point rule from (20), applied to a uniform extraordinary point at the first subdivision level, simplifies to $$F_i^k = \left[\frac{2d_i^- + d_i}{2d_i^- + 4d_i}, \frac{2d_{i+1}^- + d_{i+1}}{2d_{i+1}^- + 4d_{i+1}}\right]^T, \, d_i = e_i \text{ for } i \in \{0, \ldots, n-1\}. \quad (21)$$

When the extraordinary point is non-uniform, (20) simplifies to $$F_i^k = \left[\frac{2d_i^- + d_i}{2(d_i^- + d_i + e_i)}, \frac{2d_{i+1}^- + d_{i+1}}{2(d_{i+1}^- + d_{i+1} + e_{i+1})}\right]^T, \quad (22)$$

$$d_i \neq e_i \text{ for } i \in \{0, \ldots, n-1\}.$$

The face point correction, $F_i^{k,corr}$, may be determined by subtracting (21) from (22) and reads $$F_i^{k,corr} = \left[\frac{(2d_i^- + d_i)(d_i - e_i)}{2(d_i^- + 2d_i)(d_i^- + d_i + e_i)}, \frac{(2d_{i+1}^- + d_{i+1})(d_{i+1} - e_{i+1})}{2(d_{i+1}^- + 2d_{i+1})(d_{i+1}^- + d_{i+1} + e_{i+1})}\right]^T, \quad (23)$$

$$= [\Delta(d_i^-, d_i, e_i), \Delta(d_{i+1}^-, d_{i+1}, e_{i+1})]^T,$$

where, for notational convenience, $\Delta$ is a generic function defined as $$\Delta(a, b, c) = \frac{(2a + b)(b - c)}{2(a + 2b)(a + b + c)}. \quad (24)$$

Equation (23) is a direct correction to the numerically determined $(s, t)$ values that are determined when solving the inverse bilinear interpolation problem from (13) for the eigen polyhedron face point. The face point correction in (23) is essentially a correction of the face point portions of the eigen polyhedron subdivision mask, M. In accordance with implementations of the present disclosure, applying the correction results in an adjusted face point rule which produces a NURCCs compatible face point on the first subdivision. A NURCCs compatible face point can be a face point where the surface around the extraordinary point (e.g., including adjacent faces to the extraordinary point) would be continuous with the rest of the surface if the rest of the surface were produced using NURCCs rules. By examining the numerator of the terms in (23), it can be determined that during subsequent subdivisions, performed after a subdivision that resulted in an eigen polyhedron where $d_i = e_i$ for $i \in \{0, \ldots, n-1\}$, the value of the correction becomes zero.

In some implementations, edge point corrections which produce NURCCs compatible edge points can also be derived. The NURCCs edge points rule can be generally expressed according to formula (25):

$$E_i^k = \frac{d_{i+1}^- F_i^k + d_{i+1} F_{i-1}^k + (d_{i+1}^- + d_{i+1})M_i^k}{2(d_{i+1}^- + d_{i+1})} \quad (25)$$

where $M_i^k$ is given by formula (26)

$$M_i^k = \frac{(2d_i^- + d_i)E_i^{k-1} + (d_i + 2e_i)V^{k-1}}{2(d_i^- + d_i + e_i)}. \quad (26)$$

Working directly in the underlying parametric space of $[0,1] \times [-1,1]$ where $V^0 = [0,0]$, $E_{i-1}^0 = [0, -1]$, $F_{i-1}^0 = [1, -1]$, $E_i^0 = [1,0]$, $F_i^0 = [1,1]$, and $E_{i+1}^0 = [0,1]$, the correction to the edge point rule becomes as defined at formula (27).

$$E_i^{k,corr} = \frac{d_{i-1}}{2(d_{i-1} + d_{i+1})} F_i^{k,corr} + \frac{d_{i-1}}{2(d_{i-1} + d_{i+1})} F_{i-1}^{k,corr} + \frac{1}{2} M_i^{k,corr} \quad (27)$$

where $M_i^{k,corr}$ is given by formula (28):

$$M_i^{k,corr} = [\Delta(d_i^-, d_i, e_i), 0]^T \quad (28)$$

To correctly adjust the eigen polyhedron's edge point so that the point is NURCCs compatible, the face point corrections, $F_i^{k,corr}$ and $F_{i-1}^{k,corr}$ are to be applied (for example, added) to the $(s_i, t_i)$ and $(s_{i-1}, t_{i-1})$ derived by using the formulas in (15a), (15b), and (15c). The $(s_i, t_i)$ and $(s_{i-1}, t_{i-1})$ values are first determined by solving two inverse bilinear interpolation problems defined by (13) for the eigen polyhedron face points $F_i^1$ and $F_{i-1}^1$. Since the points $P_0$, $P_1$, $P_2$, $P_3$ (as defined at (15a), (15b), (15c)) involve only $s_{i-1}$ and $t_i$, corrections do not need to be made to either $t_{i-1}$ or $s_i$, and the rules for adjusting $s_{i-1}$ and $t_i$ follow by selecting the second component from $F_i^{k,corr}$ to correct $t_i$ and the first component from $F_{i-1}^{k,corr}$ to correct $s_{i-1}$. For example, expressions for these corrections are given by the following formulas:

$$s_{i-1}^{corr} \times \Delta(d_{i-1}^-, d_{i-1}, e_{i-1}), \quad (29)$$

$$t_i^{corr} = \Delta(d_{i+1}^-, d_{i+1}, e_{i+1}). \quad (30)$$

Additionally, a correction to the u value, which is obtained after solving the next inverse bilinear interpolation problem defined in (16), is also needed. The correction for u can be derived in part from the $1/2 M_i^{k,corr}$ correction term and the x-components of the $F_1^{k,corr}$ and $F_{i-1}^{k,corr}$ correction terms in formula (27). The correction for u can be given by formula (31):

$$u^{corr} = \Delta(d_i^-, d_i, e_i). \quad (31)$$

In accordance with implementations of the present disclosure, adjusted eigen polyhedron edge point rule that is both NURCCs and NURBS compatible can be obtained by (i) solving the inverse bilinear interpolation problem in (13) twice to obtain $(s_i, t_i)$ and $(s_{i-1}, t_{i-1})$ for input eigen polyhedron face points $F_i^1$ and $F_{i-1}^1$, (ii) using $(s_i, t_i)$, $(s_{i-1}, t_{i-1})$, and $E_i^1$ from (14) as inputs to solve the inverse bilinear interpolation problem in (16) for (u, v), (iii) correcting $s_{i-1}$ based on (29), $t_i$ based on (30), and u based on (31), and (iv) grouping all known coefficients (which involve $s_{i-1}, t_i, u, v$) of the six points $V^0, E_{i-1}^0, F_{i-1}^0, E_i^0, F_i^0, E_{i+1}^0$ to determine elements of refinement mask M, which ultimately represent the corrected edge point rule. Similar to the face point correction from formula (23), the edge point correction defined by (29), (30), and (31) becomes zero when $d_i = e_i$ for $i \in \{0, \ldots, n-1\}$ which occurs after the first subdivision.

In some implementations, the edge points according to the subdivision based on eigen polyhedron data and the adjustment rules, can be determined according to the formulas (32).

$$u^{adjusted} = u + \Delta(d_i^-, d_i, e_i)$$

$$t^{adjusted} = t + \Delta(d_{i+1}^-, d_{i+1}, e_{i+1})$$

$$s_{i-1}^{adjusted} = s_{i-1} + \Delta(d_{i-1}^-, d_{i-1}, e_{i-1})$$

Figure 7:
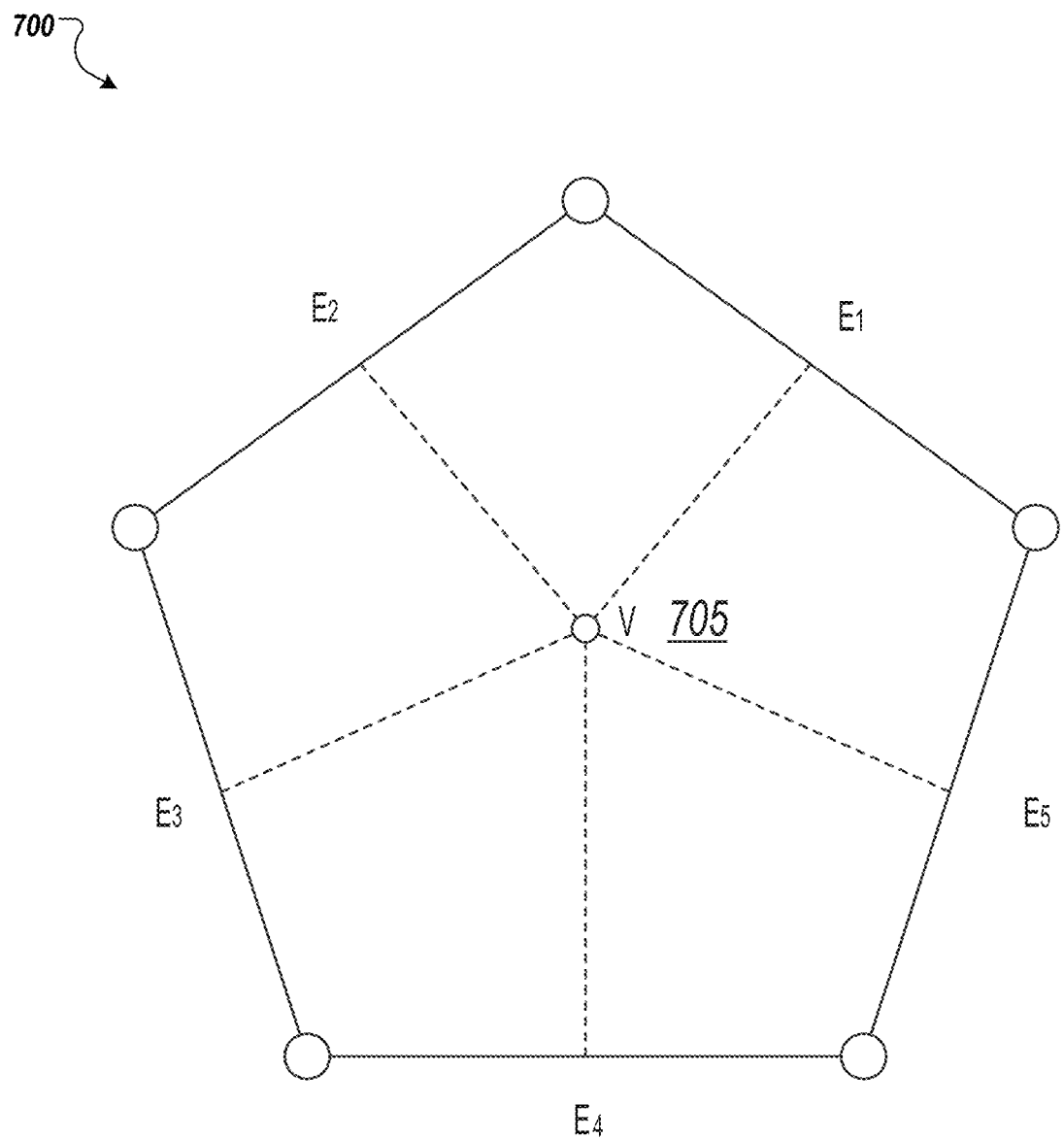
FIG. 7 shows an example 5-gon and an example subdivision of the 5-gon to include an extraordinary point and a set of face points.

FIG. 7 shows an example 5-gon 700 and an example subdivision of the 5-gon to include an extraordinary point and a set of edge points. In some implementations, an N-gon can be part of a polygonal control mesh that is undergoing subdivision. For example, the N-gon can be part of the obtained polygonal control mesh at 405 of FIG. 4. The example N-gon 700 is a 5-gon, and it can be appreciated that other examples of N-gon faces (e.g., 3-gon) can undergo a corresponding subdivision.

In accordance with implementations of the present disclosure, an extraordinary point can be generated for the N-gon 700 as part of a first subdivision for the polygonal control mesh including the N-gon 700.

In some cases, one of the control points of the 5-gon 700 can be an extraordinary point in the polygonal control mesh. In those cases, an extraordinary point can be created within the 5-gon according to NURCC subdivision rules to define a subdivision that introduces the extraordinary point in the subsequently generated refined mesh based on the initial subdivision. For example, NURCC subdivision rules can be defined as described in "T-splines and T-NURCCs, Sederberg et al, ACM Transactions on Graphics, July 2003," and in U.S. Pat. No. 7,274,364 to Sederberg, which are hereby incorporated by reference. The extraordinary point which is a control point of the 5-gon can be used to determine its adjacent face and edge points using eigen polyhedron rules, except for the face point corresponding to the 5-gon face and the edges which are part of the 5-gon face. Such adjacent face and edge points can be determined according to NURCC subdivision rules.

In some other cases, the 5-gon does not include a control point that is an extraordinary point. In those cases, a vertex point and a set of face point can be determined for the 5-gon according to the NURCC rules. For example, the vertex point can be determined in the middle of the 5-gon and represent an included extraordinary point in the extraordinary region.

Figure 8:
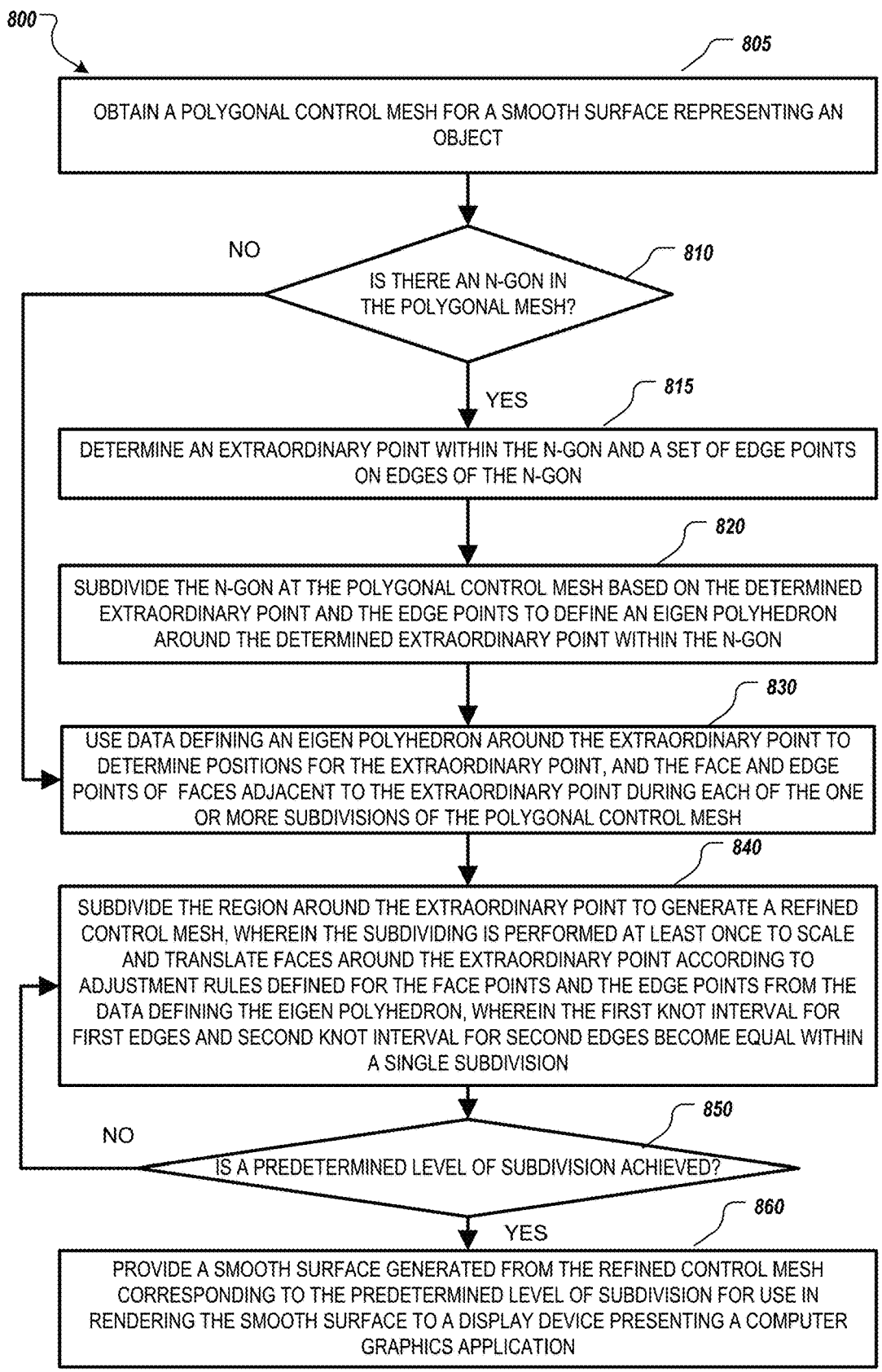
FIG. 8 shows an example of a process to produce a smooth surface from a refined control mesh based on subdivisions using data defining an eigen polyhedron around an N-gon region of a control mesh in accordance with implementations of the present disclosure.

FIG. 8 shows an example of a process 800 to produce a smooth surface from a refined control mesh based on subdivisions using data defining an eigen polyhedron around an N-gon region of a control mesh in accordance with implementations of the present disclosure.

In some implementations, the example process 800 is executed by a computer graphics application, e.g., program 116, as discussed in relation to the execution of process 400 of FIG. 4.

At 805, a polygonal control mesh for a smooth surface representing an object is obtained. The obtained mesh can be similar to the obtained mesh at 405 of FIG. 4. In some implementations, the polygonal control mesh can be obtained from a previously processed control mesh that is provided as input for subdivision at process 800. In some instances, the polygonal control mesh can be directly obtained as input from another subdivision process or can be obtained from a storage space. For example, the polygonal control mesh can be obtained after executing at least one subdivision (e.g., according to process 400 of FIG. 4 or other process) to subdivide a control mesh. In yet another example, the polygonal control mesh can be obtained based on a user input that may include information for locating the polygonal control mesh, e.g., a network path, address, in-memory storage location, or else.

At 810, it is determined whether there is an N-gon in the polygonal control mesh. For example, the polygonal control mesh may include a 5-gon as described in FIG. 7, a 6-gon, a 7-gon, among other examples of N-gons that can be determined as part of the polygonal control mesh. The polygonal control mesh can be determined to include a control polygon having N vertices with N not being equal to four. Such N-gons in the control mesh can lead to star point on the limit surface.

At 815, upon determination that there is an N-gon in the polygonal control mesh, an extraordinary point within the N-gon is determined and a set of edge-side points on the edges of the N-gon are also determined. The determination operation 815 is executed to perform a subdivision 820 of the N-gon and to introduce an extraordinary point in the N-gon area (as an "extraordinary region" corresponding to an area around an extraordinary point) and a set of edge-side points on the sides of the N-gon. By executing the subdivision 820, N four-sided faces can be created. Further, once the polygonal control mesh that includes an N-gon is initially subdivided to remove the N-gon face by the subdivision 820. The initially subdivided control mesh includes an extraordinary point (as determined at 815) and a subdivision of the extraordinary region according to refinement rules based on eigen polyhedron data can be performed to generate a smooth surface with better accuracy and without experiencing surface discontinuities. In some instances, the subdivision of the initially subdivided control mesh can be performed according to the operations defined for process 400 of FIG. 4.

If at 810 it is determined that there is no N-gon in the polygonal control mesh, operation 830 is executed to define subdivisions for a region around an extraordinary point (i.e., extraordinary region), where the extraordinary point is one of the control points of the polygonal control mesh. Once the initial subdivision (820) of the polygonal control mesh including an N-gon is performed, the N-gon can be subdivided into four-sided faces and can include an extraordinary point, where subdivisions for the region around such extraordinary point can be performed as further described at process 800. In cases where the polygonal control mesh does not initially include an N-gon (based on evaluations at 810), the process 800 can proceed with initial subdivisions that are performed for the region around an extraordinary point of the polygonal control mesh and as described according to implementations of the present disclosure (e.g., process 800 of FIG. 8, process 400 of FIG. 4).

At 820, the N-gon at the polygonal control mesh is subdivided according to the determined extraordinary point and the face points to define an eigen polyhedron around the determined extraordinary point within the N-gon. The definition of an eigen polyhedron can be performed by an additional subdivision to the area around the extraordinary point introduced within the N-gon.

At 830, data defining an eigen polyhedron around the extraordinary point as introduced by the subdivision at 820 is used to determine positions for the extraordinary point, and face points and edge points of faces adjacent to the extraordinary point during each of one or more subdivisions. In some implementations, data defining the eigen polyhedron is used to scale and translate faces around the extraordinary point in the eigen polyhedron space (a two dimensional parameterized plane space).

At 840, the region around the extraordinary point is subdivided to generate a refined control mesh. The subdivision is performed either for an extraordinary point that is a control point of the control mesh as obtained at 805, or for an extraordinary point that is introduced in an N-gon part of the control mesh. The subdivision is performed at least once to scale and translate faces around the extraordinary point according to adjustment rules defined for the face points and the edge points from the data defining the eigen polyhedron. In some implementations, the subdivision at operation 840 may correspond to the discussed subdivision at 410 of FIG. 4. According to the subdivisions at 840, a first knot interval for the first edges and second knot interval for the second edges become equal within a single subdivision.

The subdivisions performed at 820 and 840 are NURCCS and NURBS compatible, and within two subdivisions of the polygonal mesh, an eigen polyhedron is defined where the first and second knot intervals are equal.

At 850, it is determined whether a predetermined level of subdivision is achieved. In some implementations, the level of granularity of a refined control mesh can be preconfigured. For example, it can be preconfigured in a computer graphics application where the refinements are executed.

If the predetermined level of subdivision granularity is achieved, at 860, the smooth surface generated from the refined control mesh corresponding to the predetermined level of subdivision is provided for use. For example, the refined control mesh can be provided for use in rendering the smooth surface to a display device presenting a computer graphics application. The generated smooth surface may be rendered on a display interface of a display device. The rendered smooth surface may be integrated into an animation scene or a video production. For yet another example, the generated smooth surface may be used for manufacturing a physical object, e.g., using a CNC machine, and based on a toolpath specification that can be generated based on the smooth surface.

If, at 850, the predetermined level of subdivision granularity is determined as not achieved, then further subdivision is performed according to operation 840.

Figure 9:
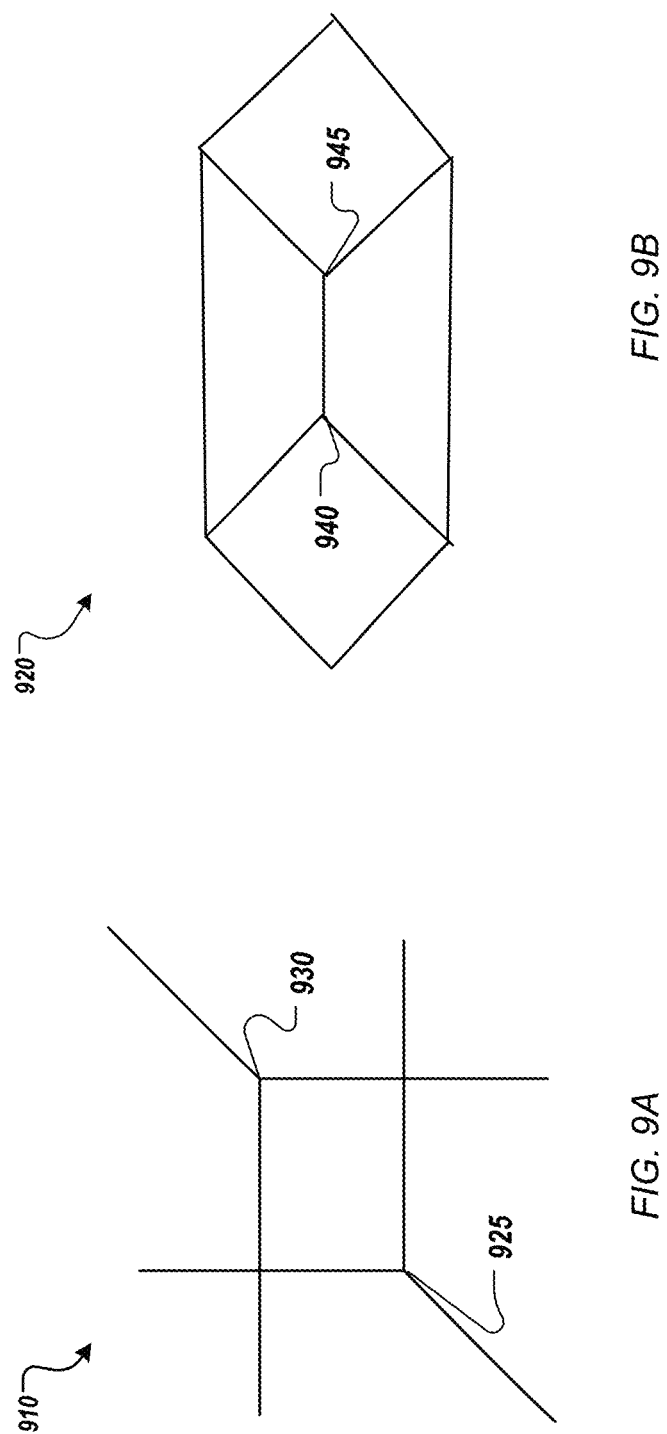
FIGS. 9A and 9B show examples of polygonal control meshes including two extraordinary points that are connected by either a single face or an edge used to generate a refined control mesh based on data defining two eigen polyhedrons around the extraordinary points in accordance with implementations of the present disclosure.

FIGS. 9A and 9B show examples of polygonal control meshes 910 and 920 including two extraordinary points that are connected by either a single face or an edge used to generate a refined control mesh based on data defining two eigen polyhedrons around the extraordinary points in accordance with implementations of the present disclosure.

At FIG. 9A, there are two extraordinary points 925, 930 that are connected by a single face, and those points are part of a control mesh that undergoes subdivision to generate a refined control mesh to generate a smooth surface. In some implementations, the subdivision of the control mesh can be performed in accordance with the logic for subdividing an area around an extraordinary point as discussed in connection with FIG. 4. As the control mesh includes extraordinary points that are connected with a face, if a subdivision of the control mesh is computed independently for those extraordinary points, there can be conflicting determined face and/or edge points for the connecting face that is part of the area around each of those extraordinary points.

At FIG. 9B, there are two extraordinary points 940, 945 that are connected with an edge, and those points are part of a control mesh that undergoes subdivision to generate a refined control mesh to generate a smooth surface. In some implementations, the subdivision of the control mesh can be performed in accordance with the logic for subdividing an area around an extraordinary point as discussed in connection with FIG. 4. As the control mesh includes extraordinary points that are connected through an edge, if a subdivision of the control mesh is computed independently for those extraordinary points, there can be conflicting face and/or edge points for the connecting edge that is part of the area around each of those extraordinary points.

In some implementations, eigen polyhedron data can be used for the different extraordinary points in a single control mesh—either control mesh 910 or control mesh 920, and adjustments can be performed for face and edge points as discussed in connection with FIG. 4.

In both cases, an eigen polyhedron can be defined for each of the extraordinary points 925 and 930, or extraordinary points 940 and 945, and first and second data corresponding to each of the extraordinary points can be used to generate face and edge points. These face and edge points can be expressed as linear combinations of control points of faces around the extraordinary points. For example, a face point within the connecting face (as part of the control mesh 910 of FIG. 9A) can be defined as a linear combination of the four control points on that face, i.e., in the form $F=k_0P_0+k_1P_1+k_2P_2+k_3P_3$. In some implementations, by computing face point and edge point for cases where the extraordinary points are connected with a face or an edge, determined values for face and edge points may be conflicting or overlapping as they are determined as linear combinations of partially or fully overlapping points that are associated with the computations. For example, for the control mesh 910, there can be conflicting results for a face point, and for the control mesh 920, there can be conflicting results for an edge point and for two face points. In order to resolve conflicting results and determine face and edge points that work for both extraordinary points, a mean of the conflicting values can be taken.

In some implementations, if two face point values—$F_a$ and $F_b$—for one face point as computed for different extraordinary points (A and B being 925 and 930 in the control mesh 910 of FIG. 9A, and A and B being 940 and 945 in the control mesh 920 of FIG. 9B) that are connected either by a face or an edge are conflicting, then an actual face point value for use for the face point for the subdivision of the control polygon (either 910 or 920) can be determined as an average value of $F_a$ and $F_b$, i.e., $F_{new}=(F_a$ and $F_b)/2$.

In some implementations, the face point values—$F_a$ and $F_b$—can be determined based on values for the face point from eigen polyhedron data and based on adjustments according to adjustment rules defined for the face and edge points.

In some implementations, based on the computed final values for face and edge points, the subdividing of the control mesh is performed.

Figure 10:
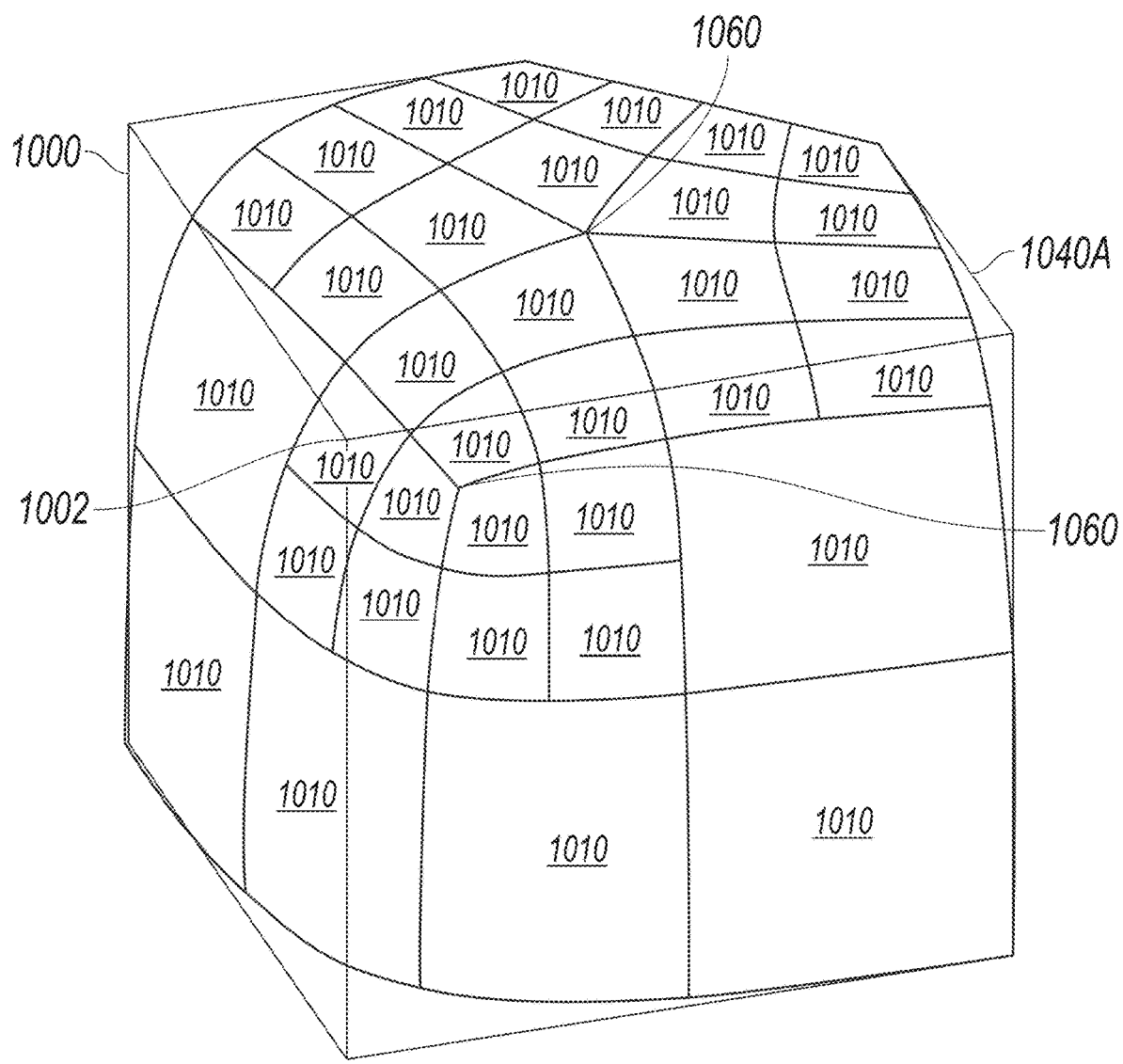
FIG. 10 is a graphical rendering showing an example of producing a curvature continuous limit surface of a polygonal control mesh.

FIG. 10 is a graphical rendering showing an example of producing a curvature continuous limit surface of a polygonal control mesh 1000, which includes both an extraordinary point 1002 and an N-gon 1004A. The control mesh 1000 can be subdivided as described for processes 400 of FIGS. 4 and 800 of FIG. 8. As shown, subdivisions of the control mesh can produce bi-cubic Bézier patches 1010 as the limit surface for the control mesh 1000.

The surface patches representing the limit surface can be checked for any star points. While star points remain, the surface patches around each star point can be processed to remove discontinuity at the star point. Subdivisions based on eigen polyhedron data and adjustment rules as discussed at least at FIG. 4 and FIG. 8, and in accordance with face point, edge point, and vertex rules for defining subdivisions to achieve an eigen polyhedron can be performed to provide a smooth surface with at least C' continuity. Patching on the surface that are away from a star point can be maintained without further subdivision. The limit surface includes continuous patches 1010 that can have varying size or can be of the same "size," i.e., the same subdivision level (not shown on FIG. 10). In some implementations, patches that are outside extraordinary regions including regions being N-gons or including a star point, can be generated as patches corresponding to the same subdivision level (or iteration) and can be of the same "size." Such subdivision of some portion of the control mesh to a certain subdivision level (e.g., only one level of subdivision) may support generation of fewer patches outside of areas that include a star point or an N-gon. Reduction of the number of subdivisions for certain areas on the control mesh may support calculations of replacement patches on the limit surface.

In some implementations, replacement surface patches can be produced for discontinuous surface patches using adjacent surface patches (that are neighbors to patches around a star point or N-gon faces) from the multiple surface patches, where the replacement surface patches are curvature continuous with each other and with the adjacent surface patches (each replacement patch has $G^2$ continuity with its adjacent patches and $G^2$ continuity with its adjacent replacement patches around the same star point in the limit surface). The computed patches are affine dependent on the surrounding patches only. Each of the replacement surface patches can be a surface patch of degree seven, e.g., a bi-septic NURBS surface, in order to achieve curvature continuous transitions. Using higher degree surfaces provides more control over the surface: a degree 3 surface has 4×4 control vertices (16 total control points), and a degree 7 surface has 8×8 (64) control vertices. This provides more freedom to adapt the boundary to the neighbors by giving the program more flexibility (more control points to tweak) in producing the replacement surface patches for the limit surface.

Figure 11A:
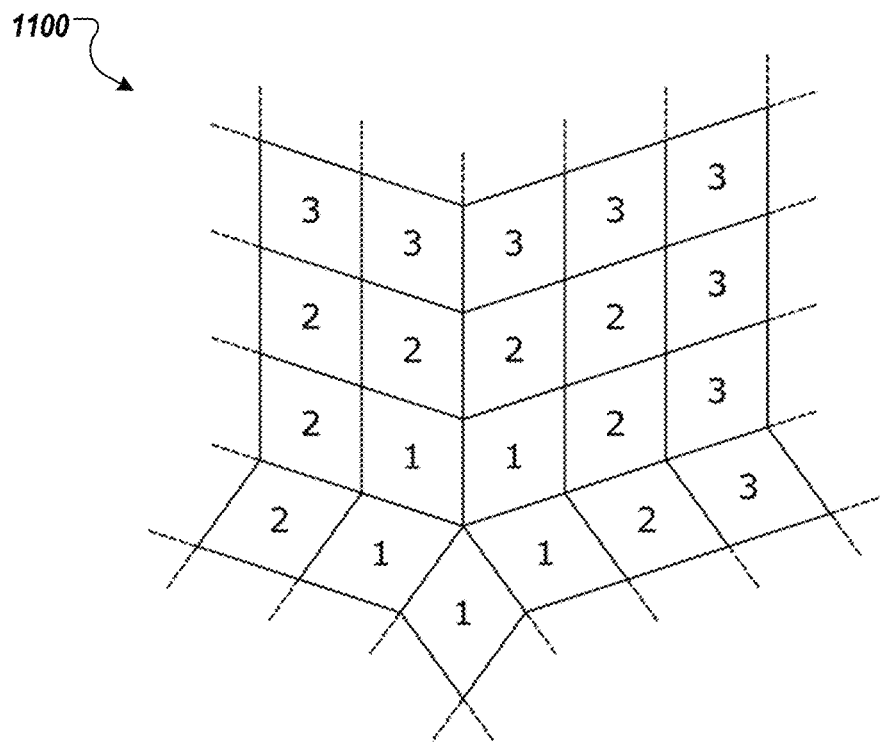
FIG. 11A is an example polygonal control mesh including an extraordinary point.

FIG. 11A is an example polygonal control mesh 1100 including an extraordinary point. In some implementations, the polygonal control mesh 1100 can be similar to the obtained control mesh at 405 of FIG. 4, or at 805 of FIG. 8. In some more implementations, the control mesh 1100 can be generated after one or more previous subdivision of an initial control mesh.

In some implementations, the polygonal control mesh 1100 can be subdivided to obtain a smooth surface for an object. Every time the polygonal control mesh 110 is subdivided, a surface with (usually) four times the face count is generated. By subdivision, a smoother shape that is closer to the limit surface's shape of the object can be achieved. In some implementations, the subdivision process can be iteratively repeated without constraints to the number of times. In some implementations, a predetermined level of subdividing the control mesh can be configured to generate a refined mesh of a certain level of subdivision.

In some implementations, the subdivision rules can be chosen in such a way that the limit surface converges to a cubic NURBS surface.

As shown in FIG. 11A, faces on the control mesh are labelled as neighbors to an extraordinary point part of the control mesh. The 1-neighborhood include those faces that are immediately adjacent to an extraordinary point. In the example of FIG. 11A, the extraordinary point has five edges. The 2-neighborhood faces include faces that touch those faces that are defined as 1-neighborhood, and can be defined as first level neighbors to faces around the extraordinary point. Further, 3-neighborhood, 4-neighborhood, and so on, can be defined for the control mesh at a given subdivision level.

In the example control mesh 1100, the faces labeled as 3-neighborhood are faces that are not adjacent to faces surrounding an extraordinary point. For NURBS surface, the faces labeled with "3" can exactly represent a limit surface using cubic Bézier patches, where one patch is created for one face from the control mesh. Those patches can be created for patches that are second level neighbors to faces around an extraordinary point (i.e., 3-neighborhood) and also for any other patches that are at a subsequent level of neighboring to that second level. In some implementations, regions including faces that are not adjacent to an extraordinary region (i.e., including faces around an extraordinary point) may not be subdivided, and at least one subdivision can be performed for control polygon faces in the extraordinary region.

In some implementations, for any face that is not within the 2-neighborhood and 1-neighborhood, a patch can be created for a face. By creating a patch from a face part of at least 3-neighborhood, without further subdivisions, a smooth representation of the limit surface for areas that are not too close to a star point can be achieved.

In some implementations, if the local region of the surface around the star point is uniform, then by using the same process of creating a patch for each face, an exact limit-surface representation can be obtained for faces that are in the 2-neighborhood. In the case, where the surface is non-uniform, the region around the star point can be further subdivided to create the limit surface representation.

In some implementations, the patches can be computed using NURBS knot insertion algorithm that can be performed locally, until a multiplicity equal to the degree for each edge surrounding the face is achieved.

Figure 11B:
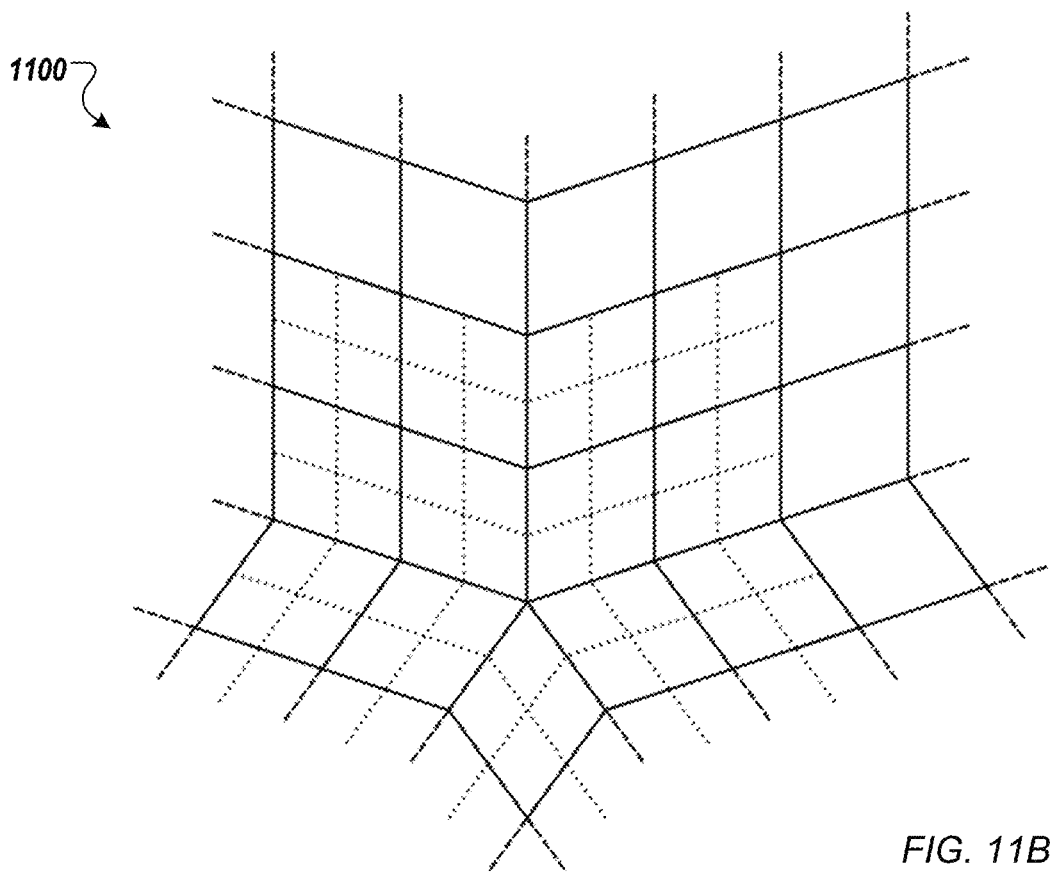
FIG. 11B is the example polygonal control mesh of FIG. 11A that includes subdivisions defined for faces that are first and second level neighbors to the extraordinary point to generate a refined control mesh.

FIG. 11B shows the example polygonal control mesh 1100 of FIG. 11A that includes subdivisions defined for faces that are first and second level neighbors to the extraordinary point to generate a refined control mesh. FIG. 11B represents a subdivision performed for faces that are in the 1- and 2-neighborhoods. The subdivision can be performed to obtain additional information about the limit surface. FIG. 11B represents performed subdivisions for the entire 2-neighborhood faces, which is an area in which Bézier patches may not be yet computed as they are adjacent to faces around an extraordinary point. Each subdivided face turns into four faces. The former 2-neighborhood can be now redefined and labeled as become the 3- and 4-neighborhood. These outer faces (part of the 2-neighborhood) can be transferred to their Bézier patches according to the same process as discussed before for faces at initial neighborhood 3 and above in relation to FIG. 11A. Each "wedge" can produce 12 additional Bézier patches. In the present example control mesh 1100, the valence is 5, and that translates to 5 times 12 that equals 60 additional patches per subdivision.

In some implementations, an optimization of the number of the produced patches for faces in the 2-neighborhood can be provided to reduce the number of patch counts. A reduction in the number of patch counts improves resource utilization as fewer computations operations for the patches are to be performed. At the example of FIG. 11B, subdivision rules that can be applied can be equivalent to NURBS knot insertion rules when subdivisions are performed sufficiently far from an extraordinary point. When we have this property of performing subdivisions sufficiently away from the extraordinary point, a reduced subdivision pattern can be used that corresponds to the pattern presented at FIG. 12.

Figure 12:
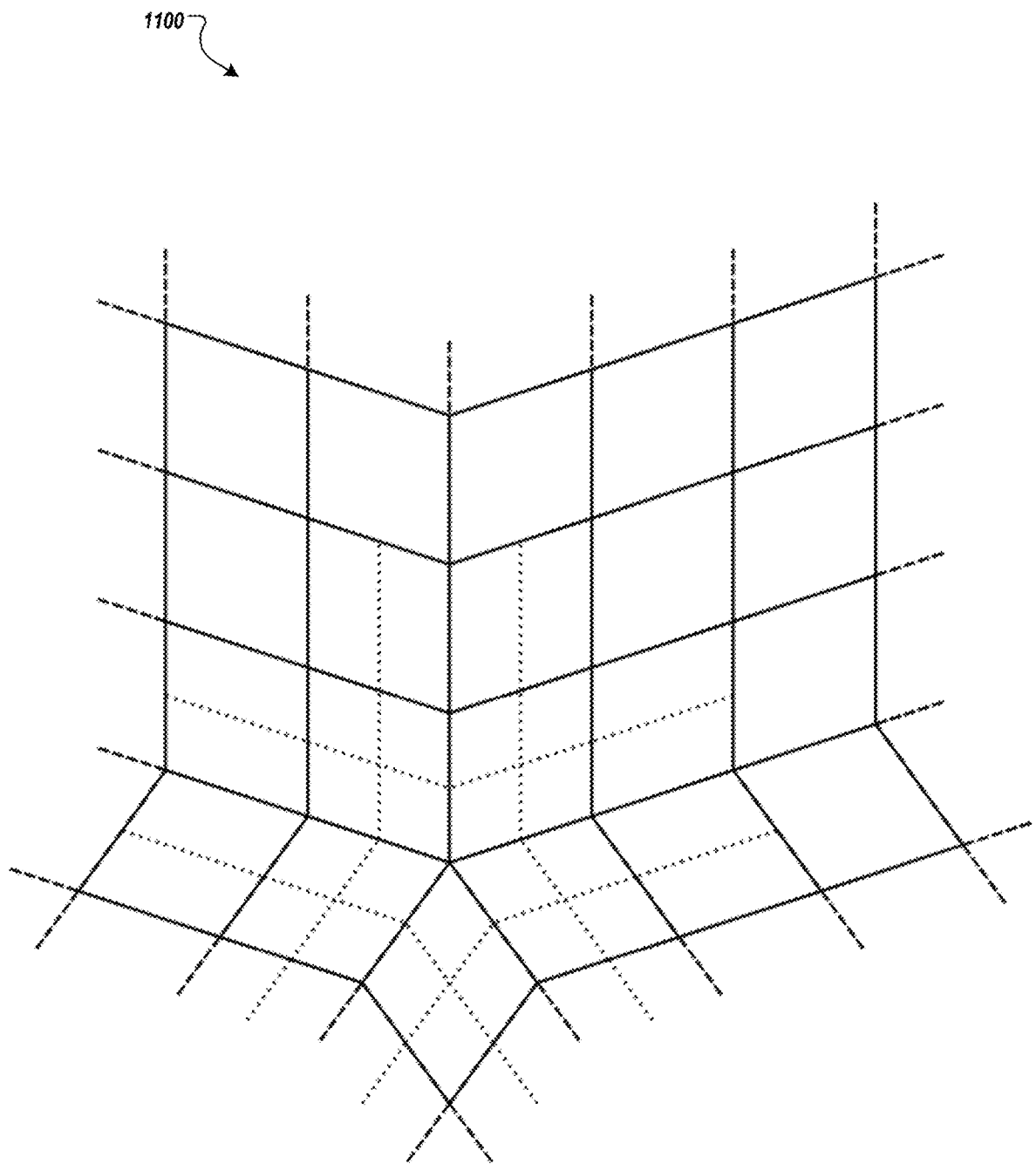
FIG. 12 is the example polygonal control mesh of FIG. 11A that includes subdivisions defined to generate a refined control mesh with a reduced number of subdivisions in accordance with implementations of the present disclosure.

FIG. 12 shows the example polygonal control mesh 1100 of FIG. 11A that includes subdivisions defined to generate a refined control mesh with a reduced number of subdivisions in accordance with implementations of the present disclosure. The control mesh 1100 is subdivided at a region around an extraordinary point to divide each face into four faces. Some of the former 2-neighborhood faces, as discussed for FIGS. 11A and 11B, are subdivided into two, and some of the faces in the 2-neighborhood have not been split at all. In the case of the faces split in two, new edge points can be computed using conventional NURBS knot insertion algorithm, not the subdivision rules. The former 2-neighborhood faces turn into faces of the 3-neighborhood, and Bézier patches can be computed for these faces. Each "wedge" can produce 5 additional Bézier patches, or a total of 25 additional patches in the case of valence 5 for the extraordinary point. According to subdivisions that define different numbers of split faces at different levels of faces around an extraordinary point, an improvement in the subdivided count of patches is achieved. In the present example, the new patches at the first level neighbors (2-neighborhood) for faces around the extraordinary point are 25 which is significantly lower when compared to a patch count of 60 patches if each face is subdivided into four faces.

In some implementations, such a subdivision scheme with reduced patch count is NURCCS and NURBS compatible, as the new faces in the 2-neighborhood can be determined based on NURBS algorithm. Further, subdivisions for the faces around the extraordinary point, i.e., faces that are 1-neighborhood, can be performed as described in connection with FIG. 4. Therefore, subdividing the control mesh 1100 by applying a reduced patch count algorithm, and subdivision(s) as discussed for FIG. 4 (based on eigen polyhedron data and adjustment rules) is NURCCS and NURBS compatible.

Figure 13:
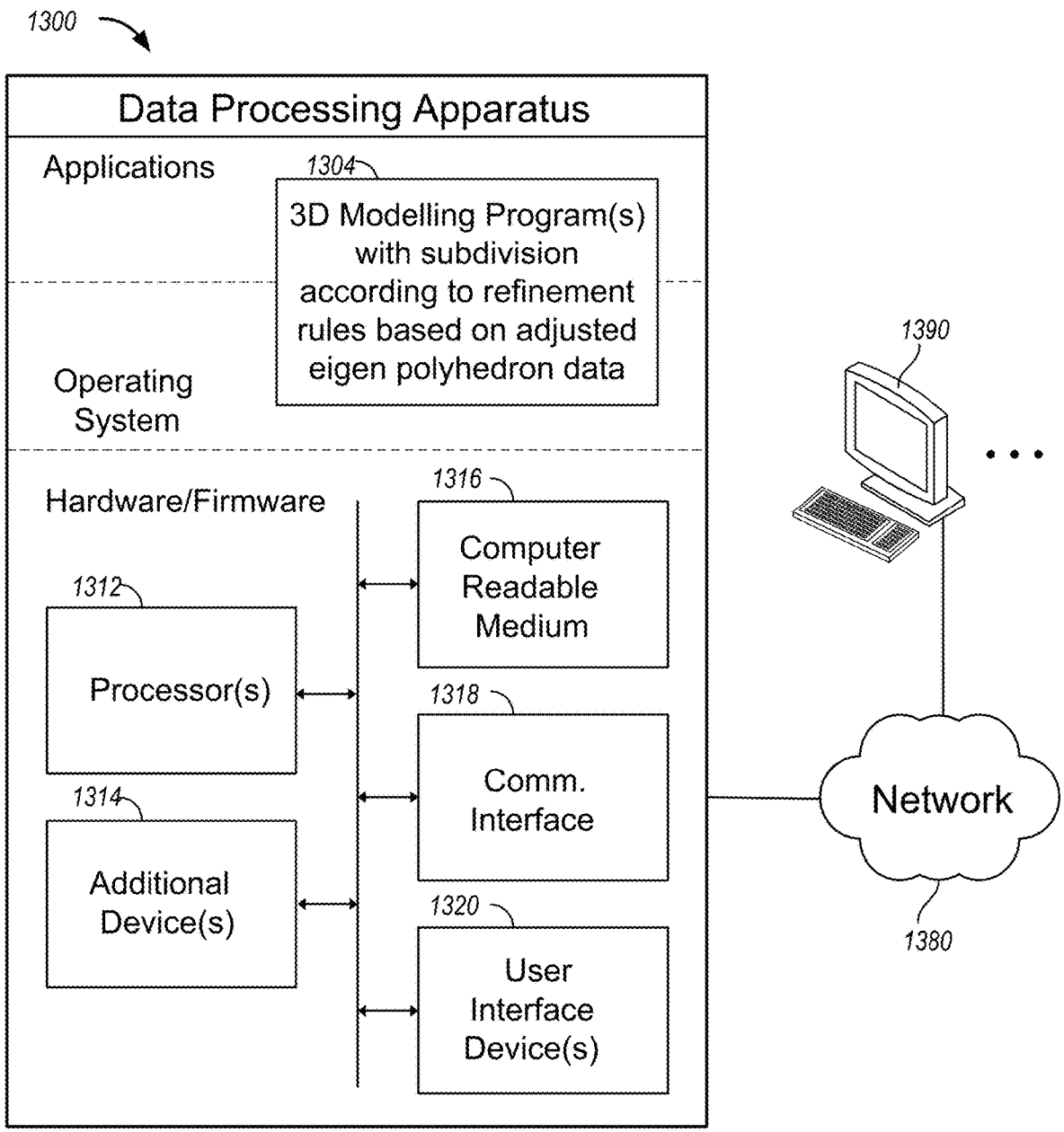
FIG. 13 is a schematic diagram of a data processing system including a data processing apparatus, which can be programmed as a client or as a server.

FIG. 13 is a schematic diagram of a data processing system including a data processing apparatus 1300, which can be programmed as a client or as a server. The data processing apparatus 1300 is connected with one or more computers 1390 through a network 1380. While only one computer is shown in FIG. 13 as the data processing apparatus 1300, multiple computers can be used. The data processing apparatus 1300 includes various software modules, which can be distributed between an applications layer and an operating system. These can include executable and/or interpretable software programs or libraries, including tools and services of one or more 3D modeling programs 1304 that implement the systems and techniques described herein. Thus, the 3D modeling program(s) 1304 can be CAD program(s) 1304 that implement 3D modeling functions and includes a subdivision technique that produces a curvature continuous limit surface by subdividing a polygonal control mesh according to refinement rules based on eigen polyhedron data and adjustment rule.

Further, the program(s) 1304 can implement physical simulation operations (finite element analysis (FEA) or other), generative design operations (e.g., using level-set based method(s) for generative design), manufacturing control operations (e.g., generating and/or applying toolpath specifications to effect manufacturing of designed objects), and/or movie animation production. The number of software modules used can vary from one implementation to another. Moreover, the software modules can be distributed on one or more data processing apparatus connected by one or more computer networks or other suitable communication networks.

The data processing apparatus 1300 also includes hardware or firmware devices including one or more processors 1312, one or more additional devices 1314, a computer readable medium 1316, a communication interface 1318, and one or more user interface devices 1320. Each processor 1312 is capable of processing instructions for execution within the data processing apparatus 1300. In some implementations, the processor 1312 is a single or multi-threaded processor. Each processor 1312 is capable of processing instructions stored on the computer readable medium 1316 or on a storage device such as one of the additional devices 1314. The data processing apparatus 1300 uses the communication interface 1318 to communicate with one or more computers 1390, for example, over the network 1380. Examples of user interface devices 1320 include a display, a camera, a speaker, a microphone, a tactile feedback device, a keyboard, a mouse, and VR and/or AR equipment. The data processing apparatus 1300 can store instructions that implement operations associated with the program(s) described above, for example, on the computer readable medium 1316 or one or more additional devices 1314, for example, one or more of a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, e.g., after delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that produces an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., a field programmable gate array (FPGA) or an application-specific integrated circuit (ASIC).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a liquid crystal display (LCD) device, an organic light emitting diode (OLED) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a browser user interface through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, actions recited in the claims can be performed in a different order and still achieve desirable results.

EXAMPLES

Example 1: A computer-implemented method comprising: obtaining, by a computer graphics application, a polygonal control mesh for a smooth surface representing an object; subdividing, by the computer graphics application, the polygonal control mesh in one or more subdivisions to produce a refined control mesh, wherein the subdividing comprises using data defining an eigen polyhedron around an extraordinary point in the polygonal control mesh to generate adjustment rules to determine positions of the extraordinary point, and face points and edge points for faces adjacent to the extraordinary point during each of the one or more subdivisions, wherein the data defining the eigen polyhedron is defined at a parameterized two-dimensional space as a plane mesh including the extraordinary point as an initial vertex in a plane, and determining, according to the adjustment rules, the positions for the extraordinary point, the face points, and the edge points for the faces adjacent to the extraordinary point, wherein first knot intervals (di) for first edges and second knot intervals (ei) for second edges become equal to each other within a numerical precision used by the computer graphics application within a single subdivision of the one or more subdivisions, wherein the first edges are directly connected with the extraordinary point and are inside a region corresponding to the eigen polyhedron at the parameterized two-dimensional space, and the second edges are directly connected with the first edges and are outside the region corresponding to the eigen polyhedron at the parameterized two-dimensional space; and generating, by the computer graphics application, the smooth surface for output from the refined control mesh.

Example 2: The computer-implemented method of Example 1, wherein the extraordinary point is one of many control vertices in the obtained polygonal control mesh, and wherein the extraordinary point is a non-uniform point in the polygonal control mesh.

Example 3: The computer-implemented method of Example 1 or 2, wherein the extraordinary point is a first extraordinary point, the data defining the eigen polyhedron is first data defining a first eigen polyhedron defined for the first extraordinary point, the obtained polygonal control mesh includes a second extraordinary point having associated second data defining a second eigen polyhedron defined for the second extraordinary point, wherein the first and the second extraordinary points are connected by either a single face or an edge, wherein the using comprises using the first data defining the first eigen polyhedron defined for the first extraordinary point and the second data defining the second eigen polyhedron defined for the second extraordinary point; wherein the determining comprises adjusting a face point value for a first face point of an adjacent face to both of the first and the second extraordinary points from the first data defining the first eigen polyhedron, wherein a first adjusted face point value for the first face point is determined based on the first data defining the first eigen polyhedron and according to the adjustment rules to determine positions of the face points at a space of the adjacent face, wherein the first adjusted face point value is defined as a first linear combination of control points of the polygonal control mesh in the first data defining the first eigen polyhedron, wherein the method further comprises adjusting a face point value for the first face point from the second data defining the second eigen polyhedron, wherein a second adjusted face point value for the first face point is determined based on the second data defining the second eigen polyhedron and according to the adjustment rules to determine positions of the face points at a space of the adjacent face, wherein the second adjusted face point value is defined as a second linear combination of control points of the polygonal control mesh in the second data defining the second eigen polyhedron, wherein the first adjusted face point value is conflicting with the second adjusted face point value, and wherein the subdividing includes determining a final adjusted face point value for the first face point as a mean of the conflicting values of the first adjusted face point value and the second adjusted face point value, wherein the final adjusted face point value is used for subdividing the polygonal control mesh.

Example 4: The computer-implemented method of Example 1, 2, or 3, wherein the extraordinary point is a first extraordinary point, the data defining the eigen polyhedron is first data defining a first eigen polyhedron defined for the first extraordinary point, the obtained polygonal control mesh includes a second extraordinary point having associated second data defining a second eigen polyhedron defined for the second extraordinary point, wherein the first and the second extraordinary points are connected by either a single face or an edge, wherein the using comprises using the first data defining the first eigen polyhedron defined for the first extraordinary point and the second data defining the second eigen polyhedron defined for the second extraordinary point; wherein the determining comprises adjusting an edge point value for a first edge point of an adjacent face to both of the first and the second extraordinary points from the first data of the first eigen polyhedron, wherein a first adjusted edge point value for the first edge point is determined based on the first data defining the first eigen polyhedron and according to the adjustment rules to determine positions of the edge points at a space of the adjacent face, wherein the first adjusted edge point value is defined as a first linear combination of control points of the polygonal control mesh in the first data defining the first eigen polyhedron; wherein the method further comprises adjusting an edge point value for the first edge point from the second data of the second eigen polyhedron, wherein a second adjusted edge point value for the first edge point is determined based on the second data defining the second eigen polyhedron and according to the adjustment rules to determine positions of the edge points at a space of the adjacent face, wherein the second adjusted edge point value is defined as a second linear combination of control points of the polygonal control mesh in the second data defining the second eigen polyhedron, wherein the first adjusted edge point value is conflicting with the second adjusted edge point value; and wherein the subdividing comprises determining a final adjusted edge point value for the first edge point as a mean of the conflicting values of the first adjusted edge point value and the second adjusted edge point value, wherein the final adjusted edge point value is used for subdividing the polygonal control mesh.

Example 5: The computer-implemented method of Example 1, 2, 3, or 4, wherein the obtained polygonal control mesh includes an N-gon, the one or more subdivisions are two or more subdivisions, and wherein the subdividing comprises an initial subdivision as a first subdivision of the two or more subdivisions, and the extraordinary point is created inside the N-gon by the initial subdivision.

Example 6: The computer-implemented method of Example 5, wherein the initial subdivision comprises locating the extraordinary point in a face of the N-gon and an initial set of edge points defining the eigen polyhedron, wherein the extraordinary point in the face of the N-gon and the initial set of edge points is determined in accordance with a Non-Uniform Rational Catmull-Clark Subdivision (NURCCS) rule.

Example 7: The computer-implemented method of Example 1, 2, 3, 4, 5, or 6, wherein the subdividing is compatible with Non-Uniform Rational Catmull-Clark Subdivision (NURCCS) and Non-Uniform Rational Basis Spline (NURBS) surfaces.

Example 8: The computer-implemented method of Example 1, 2, 3, 4, 5, 6, or 7, wherein the one or more subdivisions comprises at least one subdivision of control polygon faces in an extraordinary region of the polygonal control mesh but not in a region adjacent to the extraordinary region.

Example 9: The computer-implemented method of Example 8, wherein determining, according to the adjustment rules, the positions for the extraordinary point, the face points, and the edge points for the faces adjacent to the extraordinary point comprises: calculating adjusted face points and edge points for the faces around the extraordinary point at the corresponding face and edge spaces according to the adjustment rules and the data defining the eigen polyhedron; and converting the adjusted face points and edge points into refinement rules for determining the positions of the face and edge points on the polygonal control mesh to generate the refined control mesh.

Example 10: The computer-implemented method of Example 1, 2, 3, 4, 5, 6, 7, 8, or 9, wherein subdividing the polygonal control mesh includes subdivision of the faces around the extraordinary point into four faces, and subdividing at least a set of faces that are first level neighbors to the faces around the extraordinary point into two faces each, wherein at least the set of faces is subdivided into two faces each according to a knot insertion rule so as not to change a shape of the smooth surface.

Example 11: The computer-implemented method of Example 10, wherein the generating of the smooth surface comprises generating patches for polygons of the refined control mesh that correspond to at least second level neighbor faces of faces around the extraordinary point after subdividing.

Similar operations and processes as describes in Examples 1 to 11 may be performed in a system comprising at least one processor and a memory communicatively coupled to the at least one processor where the memory stores instructions that when executed cause the at least one processor to perform the operations. Further, a non-transitory computer-readable medium storing instructions which, when executed, cause at least one processor to perform the operations as describes in any one of the Examples 1 to 11 may also be contemplated.

What is claimed is:

1. A computer-implemented method comprising:
   obtaining, by a computer graphics application, a polygonal control mesh for a smooth surface representing an object;
   subdividing, by the computer graphics application, the polygonal control mesh in one or more subdivisions to produce a refined control mesh, wherein the subdividing comprises
      using data defining an eigen polyhedron around an extraordinary point in the polygonal control mesh to generate adjustment rules to determine positions of the extraordinary point, and face points and edge points for faces adjacent to the extraordinary point during each of the one or more subdivisions, wherein the data defining the eigen polyhedron is defined at a parameterized two-dimensional space as a plane mesh including the extraordinary point as an initial vertex in a plane, and
      determining, according to the adjustment rules, the positions for the extraordinary point, the face points, and the edge points for the faces adjacent to the extraordinary point, wherein the adjustment rules are based on results of
   calculating differences between lengths of first knot intervals ($d_i$) and second knot intervals ($e_1$), wherein the first knot intervals are for first edges, the second knot intervals are for second edges, the first edges are directly connected with the extraordinary point and are inside a region corresponding to the eigen polyhedron at the parameterized two-dimensional space, the second edges are directly connected with the first edges and are outside the region corresponding to the eigen polyhedron at the parameterized two-dimensional space, and the determining works both when the lengths of the first and second knot intervals are equal and when the lengths of the first and second knot intervals are not equal; and
   generating, by the computer graphics application, the smooth surface for output from the refined control mesh.

2. The computer-implemented method of claim 1, wherein the extraordinary point is one of many control vertices in the obtained polygonal control mesh, and wherein the extraordinary point is a non-uniform point in the polygonal control mesh.

3. The computer-implemented method of claim 1, wherein the extraordinary point is a first extraordinary point, the data defining the eigen polyhedron is first data defining a first eigen polyhedron defined for the first extraordinary point, the obtained polygonal control mesh includes a second extraordinary point having associated second data defining a second eigen polyhedron defined for the second extraordinary point, wherein the first and the second extraordinary points are connected by either a single face or an edge,
   wherein the using comprises using the first data defining the first eigen polyhedron defined for the first extraordinary point and the second data defining the second eigen polyhedron defined for the second extraordinary point;
   wherein the determining comprises adjusting a face point value for a first face point of an adjacent face to both of the first and the second extraordinary points from the first data defining the first eigen polyhedron, wherein a first adjusted face point value for the first face point is determined based on the first data defining the first eigen polyhedron and according to the adjustment rules to determine positions of the face points at a space of the adjacent face, wherein the first adjusted face point value is defined as a first linear combination of control points of the polygonal control mesh in the first data defining the first eigen polyhedron,
   wherein the method further comprises adjusting a face point value for the first face point from the second data defining the second eigen polyhedron, wherein a second adjusted face point value for the first face point is determined based on the second data defining the second eigen polyhedron and according to the adjustment rules to determine positions of the face points at a space of the adjacent face, wherein the second adjusted face point value is defined as a second linear combination of control points of the polygonal control mesh in the second data defining the second eigen polyhedron, wherein the first adjusted face point value is conflicting with the second adjusted face point value, and wherein the subdividing includes determining a final adjusted face point value for the first face point as a mean of the conflicting values of the first adjusted face point value and the second adjusted face point value, wherein the final adjusted face point value is used for subdividing the polygonal control mesh.

4. The computer-implemented method of claim 1, wherein the extraordinary point is a first extraordinary point, the data defining the eigen polyhedron is first data defining a first eigen polyhedron defined for the first extraordinary point, the obtained polygonal control mesh includes a second extraordinary point having associated second data defining a second eigen polyhedron defined for the second extraordinary point, wherein the first and the second extraordinary points are connected by either a single face or an edge, wherein the using comprises using the first data defining the first eigen polyhedron defined for the first extraordinary point and the second data defining the second eigen polyhedron defined for the second extraordinary point;

wherein the determining comprises adjusting an edge point value for a first edge point of an adjacent face to both of the first and the second extraordinary points from the first data of the first eigen polyhedron, wherein a first adjusted edge point value for the first edge point is determined based on the first data defining the first eigen polyhedron and according to the adjustment rules to determine positions of the edge points at a space of the adjacent face, wherein the first adjusted edge point value is defined as a first linear combination of control points of the polygonal control mesh in the first data defining the first eigen polyhedron;

wherein the method further comprises adjusting an edge point value for the first edge point from the second data of the second eigen polyhedron, wherein a second adjusted edge point value for the first edge point is determined based on the second data defining the second eigen polyhedron and according to the adjustment rules to determine positions of the edge points at a space of the adjacent face, wherein the second adjusted edge point value is defined as a second linear combination of control points of the polygonal control mesh in the second data defining the second eigen polyhedron, wherein the first adjusted edge point value is conflicting with the second adjusted edge point value; and wherein the subdividing comprises determining a final adjusted edge point value for the first edge point as a mean of the conflicting values of the first adjusted edge point value and the second adjusted edge point value, wherein the final adjusted edge point value is used for subdividing the polygonal control mesh.

5. The computer-implemented method of claim 1, wherein the obtained polygonal control mesh includes an N-gon, the one or more subdivisions are two or more subdivisions, and wherein the subdividing comprises an initial subdivision as a first subdivision of the two or more subdivisions, and the extraordinary point is created inside the N-gon by the initial subdivision.

6. The computer-implemented method of claim 5, wherein the initial subdivision comprises locating the extraordinary point in a face of the N-gon and an initial set of edge points defining the eigen polyhedron, wherein the extraordinary point in the face of the N-gon and the initial set of edge points is determined in accordance with a Non-Uniform Rational Catmull-Clark Subdivision (NURCCS) rule.

7. The computer-implemented method of claim 1, wherein the subdividing is compatible with Non-Uniform Rational Catmull-Clark Subdivision (NURCCS) and Non-Uniform Rational Basis Spline (NURBS) surfaces.

8. The computer-implemented method of claim 1, wherein the one or more subdivisions comprises at least one subdivision of control polygon faces in an extraordinary region of the polygonal control mesh but not in a region adjacent to the extraordinary region.

9. The computer-implemented method of claim 8, wherein determining, according to the adjustment rules, the positions for the extraordinary point, the face points, and the edge points for the faces adjacent to the extraordinary point comprises:

calculating adjusted face points and edge points for the faces around the extraordinary point at the corresponding face and edge spaces according to the adjustment rules and the data defining the eigen polyhedron; and converting the adjusted face points and edge points into refinement rules for determining the positions of the face and edge points on the polygonal control mesh to generate the refined control mesh.

10. The computer-implemented method of claim 1, wherein subdividing the polygonal control mesh includes subdivision of the faces around the extraordinary point into four faces, and subdividing at least a set of faces that are first level neighbors to the faces around the extraordinary point into two faces each, wherein at least the set of faces is subdivided into two faces each according to a knot insertion rule so as not to change a shape of the smooth surface.

11. The computer-implemented method of claim 10, wherein the generating of the smooth surface comprises generating patches for polygons of the refined control mesh that correspond to at least second level neighbor faces of faces around the extraordinary point after subdividing.

12. A system comprising:

a non-transitory storage medium having instructions of a computer aided design program stored thereon; and one or more data processing apparatus able to run the instructions of the computer aided design program to perform operations specified by the instructions of the computer aided design program to cause the one or more data processing apparatus to obtain, by a computer graphics application, a polygonal control mesh for a smooth surface representing an object;

subdivide, by the computer graphics application, the polygonal control mesh in one or more subdivisions to produce a refined control mesh, wherein the instructions configured to cause the data processing apparatus to subdivide comprise instructions configured to cause the data processing apparatus to use data defining an eigen polyhedron around an extraordinary point in the polygonal control mesh to generate adjustment rules to determine positions of the extraordinary point, and face points and edge points for faces adjacent to the extraordinary point during each of the one or more subdivisions, wherein the data defining the eigen polyhedron is defined at a parameterized two-dimensional space as a plane mesh including the extraordinary point as an initial vertex in a plane, and determine, according to the adjustment rules, the positions for the extraordinary point, the face points, and the edge points for the faces adjacent to the extraordinary point, wherein the adjustment rules are based on results of calculating differences between lengths of first knot intervals ($d_i$) and second knot intervals ($e_i$), wherein the first knot intervals are for first edges, the second knot intervals are for second edges, the first edges are directly connected with the extraordinary point and are inside a region corresponding to the eigen polyhedron at the parameterized two-dimensional space, the second edges are directly connected with the first edges and are outside the region corresponding to the eigen polyhedron at the parameterized two-dimensional space, and the determination of the positions works both when the lengths of the first and second knot intervals are equal and when the lengths of the first and second knot intervals are not equal; and generate, by the computer graphics application, the smooth surface for output from the refined control mesh.

13. The system of claim 12, wherein the extraordinary point is one of many control vertices in the obtained polygonal control mesh, and wherein the extraordinary point is a non-uniform point in the polygonal control mesh.

14. The system of claim 12, wherein the obtained polygonal control mesh includes an N-gon, the one or more subdivisions are two or more subdivisions, and wherein the instructions configured to cause the data processing apparatus to subdivide comprise instructions configured to cause the data processing apparatus to subdivide an initial subdivision as a first subdivision of the two or more subdivisions, the extraordinary point is created inside the N-gon by the initial subdivision, and wherein the initial subdivision comprises locating the extraordinary point in a face of the N-gon and an initial set of edge points defining the eigen polyhedron, wherein the extraordinary point in the face of the N-gon and the initial set of edge points are determined in accordance with a Non-Uniform Rational Catmull-Clark Subdivision (NURCCS) rule, and wherein the subdividing is compatible with Non-Uniform Rational Catmull-Clark Subdivision (NURCCS) and Non-Uniform Rational Basis Spline (NURBS) surfaces.

15. The system of claim 12, wherein the one or more subdivisions comprises at least one subdivision of control polygon faces in an extraordinary region of the polygonal control mesh but not in a region adjacent to the extraordinary region, and wherein the instructions configured to cause the data processing apparatus to determine, according to the adjustment rules, the positions for the extraordinary point, the face points, and the edge points for the faces adjacent to the extraordinary point comprise instructions configured to cause the data processing apparatus to:

calculate adjusted face points and edge points for the faces around the extraordinary point at the corresponding face and edge spaces according to the adjustment rules and the data defining the eigen polyhedron; and convert the adjusted face points and edge points into refinement rules for determining the positions of the face and edge points on the polygonal control mesh to generate the refined control mesh.

16. The system of claim 12, wherein the instructions configured to cause the data processing apparatus to subdivide the polygonal control mesh include instructions to subdivide the faces around the extraordinary point into four faces, and subdivide at least a set of faces that are first level neighbors to the faces around the extraordinary point into two faces each, wherein at least the set of faces is subdivided into two faces each according to a knot insertion rule so as not to change a shape of the smooth surface, wherein the instructions configured to cause the data processing apparatus to generate the smooth surface comprise instructions configured to cause the data processing apparatus to generate patches for polygons of the refined control mesh that correspond to at least second level neighbor faces of faces around the extraordinary point after subdividing.

17. A non-transitory computer-readable medium encoding instructions operable to cause data processing apparatus to perform operations comprising:

obtaining, by a computer graphics application, a polygonal control mesh for a smooth surface representing an object;

subdividing, by the computer graphics application, the polygonal control mesh in one or more subdivisions to produce a refined control mesh, wherein the subdividing comprises using data defining an eigen polyhedron around an extraordinary point in the polygonal control mesh to generate adjustment rules to determine positions of the extraordinary point, and face points and edge points for faces adjacent to the extraordinary point during each of the one or more subdivisions, wherein the data defining the eigen polyhedron is defined at a parameterized two-dimensional space as a plane mesh including the extraordinary point as an initial vertex in a plane, and determining, according to the adjustment rules, the positions for the extraordinary point, the face points, and the edge points for the faces adjacent to the extraordinary point, wherein the adjustment rules are based on results of calculating differences between lengths of first knot intervals ($d_i$) and second knot intervals ($e_i$), wherein the first knot intervals are for first edges, the second knot intervals are for second edges, first edges are directly connected with the extraordinary point and are inside a region corresponding to the eigen polyhedron at the parameterized two-dimensional space, the second edges are directly connected with the first edges and are outside the region corresponding to the eigen polyhedron at the parameterized two-dimensional space, and the determining works both when the lengths of the first and second knot intervals are equal and when the lengths of the first and second knot intervals are not equal; and generating, by the computer graphics application, the smooth surface for output from the refined control mesh.

18. The computer-readable medium of claim 17, wherein the extraordinary point is one of many control vertices in the obtained polygonal control mesh, and wherein the extraordinary point is a non-uniform point in the polygonal control mesh.

19. The computer-readable medium of claim 17, wherein the obtained polygonal control mesh includes an N-gon, the one or more subdivisions are two or more subdivisions, and wherein the subdividing comprises an initial subdivision as a first subdivision of the two or more subdivisions, and the extraordinary point is created inside the N-gon by the initial subdivision.

20. The computer-readable medium of claim 17, wherein the initial subdivision comprises locating the extraordinary point in a face of the N-gon and an initial set of edge points defining the eigen polyhedron, wherein the extraordinary point in the face of the N-gon and the initial set of edge points is determined in accordance with a Non-Uniform Rational Catmull-Clark Subdivision (NURCCS) rules, wherein the subdividing is compatible with Non-Uniform Rational Catmull-Clark Subdivision (NURCCS) and Non-Uniform Rational Basis Spline (NURBS) surfaces.

* * * * *

UNITED STATES PATENT AND TRADEMARK OFFICE
CERTIFICATE OF CORRECTION

PATENT NO. : 11,620,793 B2
APPLICATION NO. : 17/212963
DATED : April 4, 2023
INVENTOR(S) : Kevin James Marshall, Nicholas Stewart North and Adam Michael Helps It is certified that error appears in the above-identified patent and that said Letters Patent is hereby corrected as shown below:

On the Title Page

Column 2 (Item (56) Other Publications), Line 1: delete "G1 Non-Uniform Catmull-ClarkSurfaces," and insert --$G^1$ Non-Uniform Catmull-Clark Surfaces,--, therefor.

In the Claims

Column 34, Line 10, in Claim 1: delete "($e_1$)," and insert --($e_i$),--, therefor.

Column 38, Line 45, in Claim 17: after "edges," insert --the--.

Signed and Sealed this
Sixth Day of June, 2023

Katherine Kelly Vidal
*Director of the United States Patent and Trademark Office*